(12) United States Patent
Aanegola et al.

(10) Patent No.: US 8,362,695 B2
(45) Date of Patent: Jan. 29, 2013

(54) LIGHT EMITTING DIODE COMPONENT

(75) Inventors: Srinath K. Aanegola, Parma Heights, OH (US); Emil V. Radkov, Euclid, OH (US); James Reginelli, North Royalton, OH (US); Larry R. Stadelman, Stow, OH (US); Matthew Mrakovich, Streetsboro, OH (US); Tomislav J. Stimac, Concord, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 208 days.

(21) Appl. No.: 12/884,612

(22) Filed: Sep. 17, 2010

(65) Prior Publication Data

US 2011/0001422 A1    Jan. 6, 2011

Related U.S. Application Data

(63) Continuation of application No. 11/312,268, filed on Dec. 20, 2005, now Pat. No. 7,800,121, which is a continuation-in-part of application No. 10/831,862, filed on Apr. 26, 2004, now Pat. No. 7,224,000, which is a continuation-in-part of application No.

(Continued)

(51) Int. Cl.
*H01J 1/62* (2006.01)

(52) U.S. Cl. ........................................................ 313/506

(58) Field of Classification Search .................. 313/498, 313/501, 502, 504, 506, 512
See application file for complete search history.

(56) References Cited

U.S. PATENT DOCUMENTS

| | | | |
|---|---|---|---|
| 5,093,576 A | 3/1992 | Edmond | |
| 5,526,455 A | 6/1996 | Akita et al. | |
| 5,632,551 A | 5/1997 | Roney et al. | |
| 5,812,717 A | 9/1998 | Gilliland | |
| 5,813,753 A * | 9/1998 | Vriens et al. | 362/293 |
| 5,959,316 A | 9/1999 | Lowery | |
| 5,962,971 A | 10/1999 | Chen | |
| 6,204,523 B1 | 3/2001 | Carey | |
| 6,234,648 B1 | 5/2001 | Borner et al. | |
| 6,294,800 B1 | 9/2001 | Duggal et al. | |
| 6,335,548 B1 | 1/2002 | Roberts et al. | |
| 6,345,903 B1 | 2/2002 | Koike et al. | |
| 6,351,069 B1 | 2/2002 | Lowery et al. | |

(Continued)

FOREIGN PATENT DOCUMENTS

| | | |
|---|---|---|
| CA | 2220031 | 1/2004 |
| CA | 2496937 | 3/2004 |

(Continued)

OTHER PUBLICATIONS

Y. Ohno, "Color Rendering and Lumious Efficacy of White LED Spectra", Proc. SPIE Solid State Lighting Conference, Aug. 3-5, 2004, Denver (2004). GE Lighting, "Breakthrough Technology," pp. 5, 2001.
Emil Radkov, "High Quality White Light with Near-UV LED Chips," presented at 3$^{rd}$ Annual Phophor Global Summit, Mar. 2, 2005, SanDiego, CA (2005).

* cited by examiner

*Primary Examiner* — Vip Patel
(74) *Attorney, Agent, or Firm* — Fay Sharpe LLP

(57) ABSTRACT

In a lighting package, a printed circuit board supports at least one light emitting die. A light transmissive cover is disposed over the at least one light emitting die. A phosphor is disposed on or inside of the light transmissive dome-shaped cover. The phosphor outputs converted light responsive to irradiation by the at least one light emitting die. An encapsulant substantially fills an interior volume defined by the light-transmissive cover and the printed circuit board.

26 Claims, 18 Drawing Sheets

Related U.S. Application Data

PCT/US03/27363, filed on Aug. 29, 2003, application No. 12/884,612, which is a continuation-in-part of application No. 10/909,564, filed on Nov. 2, 2004, now Pat. No. 7,768,189.

(60) Provisional application No. 60/407,426, filed on Aug. 30, 2002.

(56) References Cited

U.S. PATENT DOCUMENTS

| | | |
|---|---|---|
| 6,410,940 B1 | 6/2002 | Jiang et al. |
| 6,429,583 B1 | 8/2002 | Levinson et al. |
| 6,465,961 B1 | 10/2002 | Cao |
| 6,472,765 B1 | 10/2002 | Sano et al. |
| 6,498,355 B1 | 12/2002 | Harrah et al. |
| 6,504,301 B1 | 1/2003 | Lowery |
| 6,522,065 B1 | 2/2003 | Srivastava et al. |
| 6,538,371 B1 | 3/2003 | Duggal et al. |
| 6,541,800 B2 | 4/2003 | Barnett et al. |
| 6,578,986 B2 | 6/2003 | Swaris et al. |
| 6,590,235 B2 | 7/2003 | Carey |
| 6,600,175 B1 | 7/2003 | Baretz et al. |
| 6,610,563 B1 | 8/2003 | Waitl et al. |
| 6,614,103 B1 | 9/2003 | Durocher et al. |
| 6,621,211 B1 | 9/2003 | Srivastava et al. |
| 6,635,987 B1 | 10/2003 | Wojnarowski et al. |
| 6,642,618 B2 | 11/2003 | Yagi et al. |
| 6,657,379 B2 | 12/2003 | Ellens et al. |
| 6,661,030 B2 | 12/2003 | Komoto |
| 6,661,167 B2 | 12/2003 | Eliashevich et al. |
| 6,670,748 B2 | 12/2003 | Ellens et al. |
| 6,674,233 B2 | 1/2004 | Ellens et al. |
| 6,680,569 B2 | 1/2004 | Mueller-Mach et al. |
| 6,683,325 B2 | 1/2004 | Waitl et al. |
| 6,685,852 B2 | 2/2004 | Setlur et al. |
| 6,717,353 B1 | 4/2004 | Mueller et al. |
| 6,720,584 B2 | 4/2004 | Hata et al. |
| 6,746,885 B2 | 6/2004 | Cao |
| 6,812,503 B2 | 11/2004 | Lin et al. |
| 6,817,783 B2 | 11/2004 | Lee et al. |
| 6,841,933 B2 | 1/2005 | Yamanaka et al. |
| 6,850,001 B2 | 2/2005 | Takekume |
| 6,871,981 B2 | 3/2005 | Alexanderson et al. |
| 7,029,935 B2 | 4/2006 | Negley et al. |
| 7,101,061 B2 | 9/2006 | Nagai et al. |
| 7,453,195 B2 | 11/2008 | Radkov et al. |
| 2001/0000622 A1 | 5/2001 | Reeh et al. |
| 2001/0045573 A1 | 11/2001 | Waitl et al. |
| 2002/0043926 A1 | 4/2002 | Takahashi et al. |
| 2002/0079506 A1 | 6/2002 | Komoto et al. |
| 2002/0079837 A1 | 6/2002 | Okazaki |
| 2002/0080501 A1 | 6/2002 | Kawae et al. |
| 2002/0084745 A1 | 7/2002 | Wang et al. |
| 2002/0084748 A1 | 7/2002 | Ayala et al. |
| 2002/0117676 A1 | 8/2002 | Katoh |
| 2002/0158565 A1 | 10/2002 | Setlur |
| 2002/0158578 A1 | 10/2002 | Eliashevich et al. |
| 2002/0163006 A1 | 11/2002 | Yoganandan et al. |
| 2003/0038291 A1 | 2/2003 | Cao |
| 2003/0039119 A1 | 2/2003 | Cao |
| 2003/0039120 A1 | 2/2003 | Cao |
| 2003/0067008 A1 | 4/2003 | Srivastava et al. |
| 2003/0067265 A1 | 4/2003 | Srivastava et al. |
| 2003/0107046 A1 | 6/2003 | Waitl et al. |
| 2003/0141563 A1 | 7/2003 | Wang |
| 2003/0146690 A1 | 8/2003 | Ellens et al. |
| 2003/0214616 A1 | 11/2003 | Komoto et al. |
| 2004/0000862 A1 | 1/2004 | Setlur et al. |
| 2004/0000867 A1 | 1/2004 | Chen |
| 2004/0012027 A1 | 1/2004 | Keller et al. |
| 2004/0051111 A1 | 3/2004 | Ota et al. |
| 2004/0056256 A1 | 3/2004 | Bokor et al. |
| 2004/0170864 A1 | 9/2004 | Liu |
| 2004/0207998 A1 | 10/2004 | Suehiro et al. |
| 2004/0227149 A1 | 11/2004 | Ibbetson et al. |
| 2004/0256630 A1 | 12/2004 | Cao |
| 2004/0257797 A1 | 12/2004 | Suehiro et al. |
| 2005/0029927 A1 | 2/2005 | Setlur et al. |
| 2005/0093430 A1 | 5/2005 | Ibbetson |
| 2005/0227388 A1 | 10/2005 | Setlur et al. |
| 2005/0239227 A1 | 10/2005 | Aanegola et al. |
| 2006/0022582 A1 | 2/2006 | Radkov |
| 2006/0066209 A1 | 3/2006 | Chau |
| 2007/0132366 A1* | 6/2007 | Yabe et al. .................. 313/501 |
| 2007/0267976 A1 | 11/2007 | Bohler et al. |

FOREIGN PATENT DOCUMENTS

| | | |
|---|---|---|
| CA | 2515647 | 9/2004 |
| CA | 2517009 | 9/2004 |
| CA | 2523544 | 11/2004 |
| CA | 2549822 | 5/2005 |
| CN | 2425428 | 3/2001 |
| CN | 2425428 Y | 3/2001 |
| DE | 4208172 B4 | 5/2006 |
| EP | 0415640 | 3/1991 |
| EP | 0854523 | 7/1998 |
| EP | 859967 B1 | 8/1999 |
| EP | 1081771 | 3/2001 |
| EP | 1138747 A2 | 10/2001 |
| EP | 1139440 | 10/2001 |
| EP | 1191608 | 3/2002 |
| EP | 1220332 A2 | 7/2002 |
| EP | 1220332 A3 | 7/2002 |
| EP | 942474 B1 | 4/2006 |
| EP | 1573870 | 7/2007 |
| GB | 2347018 A | 8/2000 |
| GB | 2405409 | 3/2005 |
| GB | 2413896 A | 9/2005 |
| GB | 2424123 A | 9/2006 |
| JP | 07 193281 | 7/1995 |
| JP | 10-282916 | 10/1998 |
| JP | P2000-22216 A | 1/2000 |
| JP | 2000-101148 | 4/2000 |
| JP | 2000-123620 | 4/2000 |
| JP | 2000-156526 | 6/2000 |
| JP | 2000-164012 | 6/2000 |
| JP | 2000-315822 | 11/2000 |
| JP | 2000-315824 | 11/2000 |
| JP | 2001-035239 | 2/2001 |
| JP | 2001-057445 | 2/2001 |
| JP | 2001-111115 | 4/2001 |
| JP | 01-173239 | 6/2001 |
| JP | 2001-243807 | 9/2001 |
| JP | 2001-243809 | 9/2001 |
| JP | 2001-274463 | 10/2001 |
| JP | 2002-133925 | 5/2002 |
| JP | 2002-141558 | 5/2002 |
| JP | 2002-150821 | 5/2002 |
| JP | 2002-261328 | 9/2002 |
| JP | 2002-304902 | 10/2002 |
| JP | 2003-023183 | 1/2003 |
| JP | 2003-037298 | 2/2003 |
| JP | 2003-110150 | 4/2003 |
| JP | 2003-110151 | 4/2003 |
| JP | 2003-206481 | 7/2003 |
| JP | 2003-206482 | 7/2003 |
| JP | 2003-224306 | 8/2003 |
| KR | 100405453 | 11/2003 |
| TW | 457731 B | 12/1999 |
| WO | WO 00/57490 | 9/2000 |
| WO | WO 01/40702 | 6/2001 |
| WO | WO 0189001 | 11/2001 |
| WO | WO 02/089175 | 11/2002 |
| WO | WO 02/091489 | 11/2002 |
| WO | WO 2004/075308 | 2/2004 |
| WO | WO 2004/021461 | 3/2004 |
| WO | WO 2004/023522 | 3/2004 |
| WO | WO 2004/077580 | 10/2004 |
| WO | WO 2004/100279 | 11/2004 |
| WO | WO 2005/004202 | 1/2005 |
| WO | WO 2005/043627 | 5/2005 |

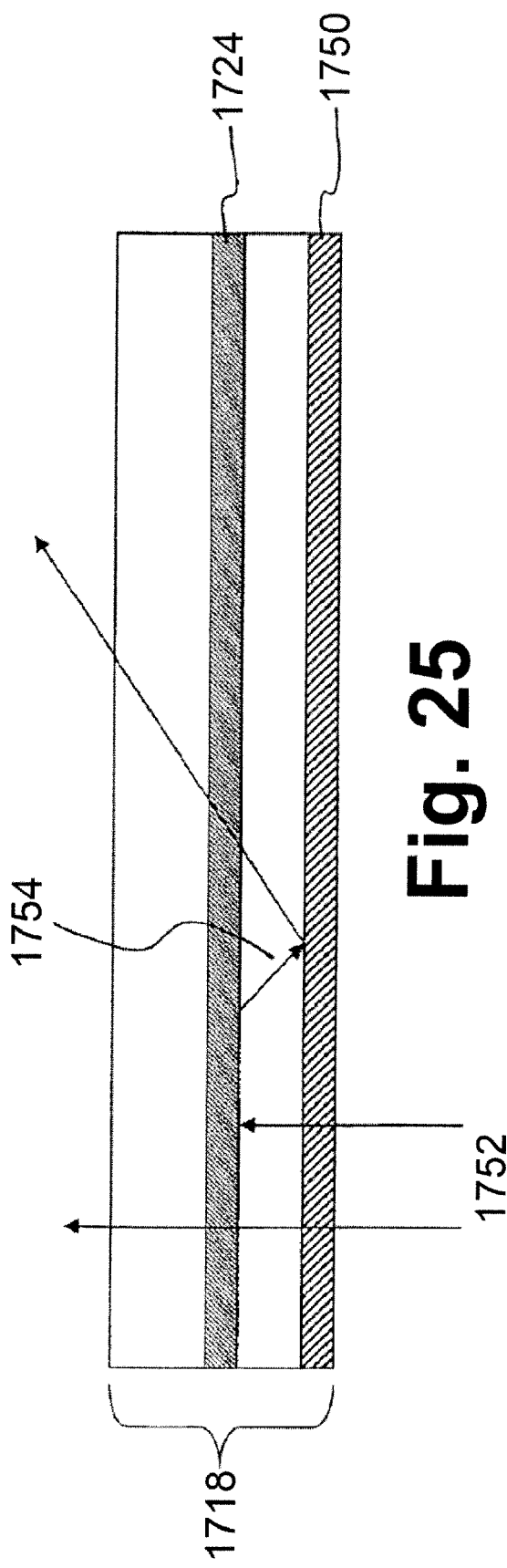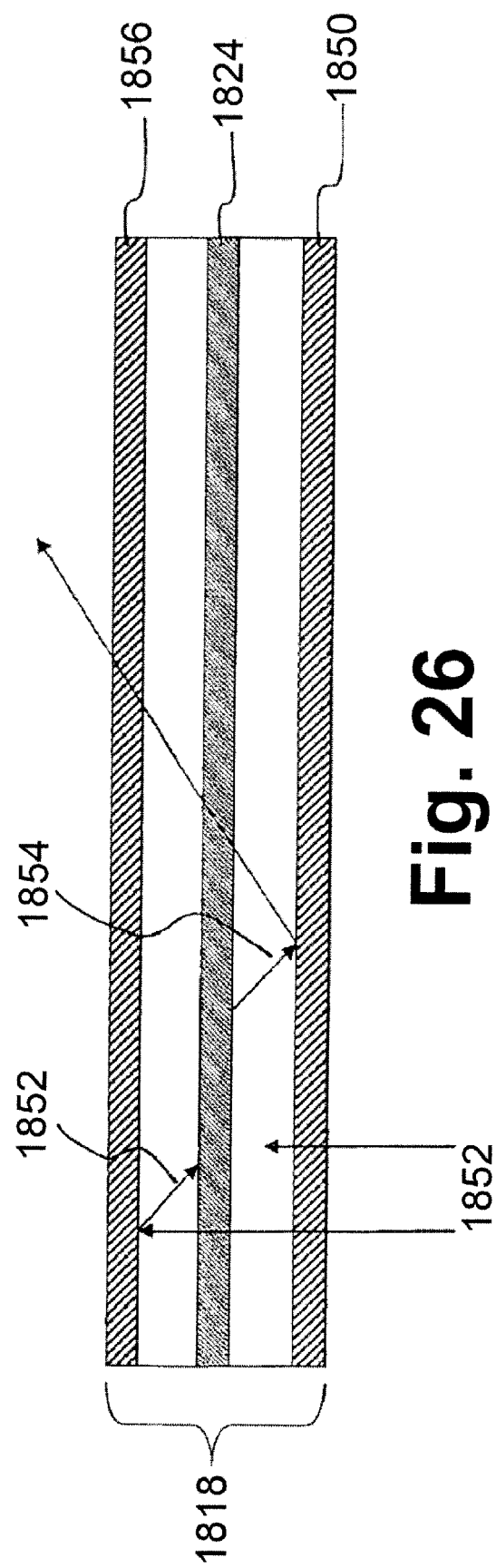

LIGHT EMITTING DIODE COMPONENT

This application is a continuation of application Ser. No. 11/312,268 filed Dec. 20, 2005 now U.S. Pat. No. 7,800,121 which is a continuation-in-part of application Ser. No. 10/831,862 filed Apr. 26, 2004 and since issued as U.S. Pat. No. 7,224,000 which is a continuation-in-part of International Application number PCT/US2003/027363 with an international filing date of Aug. 29, 2003 first published Mar. 11, 2004 as International Publication no. WO 2004/021461 A2, which claims the benefit of U.S. Provisional Application Ser. No. 60/407,426 filed on Aug. 30, 2002. This application is also a continuation-in-part of application Ser. No. 10/909,564 filed Nov. 2, 2004 and since issued as U.S. Pat. No. 7,768,189.

This application incorporates by reference the content of application Ser. No. 11/312,268, which has published as US 2006-0097245 A1. This application incorporates by reference the content of application Ser. No. 10/831,862, which has issued as U.S. Pat. No. 7,224,000 and has published as US 2005-0239227 A1. This application incorporates by reference the content of International Application number PCT/US2003/027363. This application incorporates by reference the content of U.S. Provisional Application Ser. No. 60/407,426. This application incorporates by reference the content of application Ser. No. 10/909,564, which has published as US 2006-0022582 A1 and has issued as U.S. Pat. No. 7,768,189.

BACKGROUND

The present invention relates to the lighting arts. It especially relates to single-chip and multiple-chip light emitting diode components and methods for making same, and will be described with particular reference thereto. However, the invention applies to light emitting packages generally, and is applicable in packaging monolithic light emitting diode array dice, edge-emitting laser dice, vertical cavity light emitting dice or monolithic laser array dice, organic light emitting devices or organic light emitting array devices, and the like. The inventive light emitting packages and components will find application in substantially any application that employs one or more light sources.

Light emitting diode components provide illumination in small, rugged, reliable packages. Light emitting diodes have been developed in many colors spanning the visible spectrum and extending into the infrared and ultraviolet. While each light emitting diode typically emits light in a narrow spectral range, primary color light emitting diodes can be combined to emit white light. In another approach for generating white light, light from a blue, violet, or ultraviolet light emitting diode is coupled with a suitable phosphor to produce white light. Other colors can similarly be generated by suitable selection of light emitting die components, phosphors, and combinations of die components and phosphors.

One issue with light emitting diode components or packages relates to light output intensity. Early light emitting diodes had low light output intensities and were generally not competitive with incandescent and fluorescent light sources. Improvements in crystal growth, device fabrication, packaging methods, phosphor materials, and the like have substantially improved the light output intensities of modern light emitting diode packages. However, improvements in light output intensities are still being sought.

Another issue with light emitting diode components and packages relates to ruggedness. Commonly used packaging techniques, such as bonding of the dice to lead frames, can produce relatively fragile light emitting packages. Moreover, light emitting diode components and packages tend to be complex. A typical single-chip package may include, for example, a light emitting diode die, a lead frame, an encapsulant disposed over the light emitting diode die and a portion of the lead frame, and a phosphor embedded in the encapsulant.

Multiple chip packages generally further increase complexity. One example of such a multiple chip package is disclosed in Lowery, U.S. Pat. No. 6,504,301, which shows various arrangements involving generally wire-bonded interconnection of a plurality of light emitting dice disposed on a support placed in a housing including a cylindrical casing and a fluorescent plate. A similar multiple chip package is disclosed in Baretz et al., U.S. Pat. No. 6,600,175. Baretz discloses a phosphor contained in an encapsulant disposed inside the housing, The complexity of multiple chip packages such as those of Lowery and Baretz can adversely impact manufacturability, reliability, and manufacturing costs.

Another issue with typical light emitting diode packages and components is operating lifetime. Performance of packages employing phosphor wavelength conversion of ultraviolet or short-wavelength visible light typically degrades over time due to discoloration or other degradation of the encapsulant or other materials caused by the ultraviolet or short-wavelength visible light irradiation.

Another issue with typical light emitting diode packages is plug-in capability with lighting fixtures. A typical light emitting diode package is configured as a discrete electronic component and includes a lead frame or other electronic component mounting arrangement designed for solder connection. This approach is suitable for applications such as visual power indicators. For illumination, however, the light emitting diode package would desirably be used in a manner more analogous to a light bulb, fluorescent lighting tube, halogen bulb, or so forth, rather than as a discrete electronic component. To enable plug-in capability, the light emitting diode package for illumination applications should be readily connectable with existing illumination fixtures such as Edison sockets, track lighting fixtures, or so forth. Such plug-in fixture compatibility is, however, hampered by the typically high voltage and/or high frequency electrical power supplied by such fixtures, which is not conducive to powering low-voltage light emitting diode devices.

Another issue with using light emitting diode packages for illumination is light output quality. When light emitting diode packages employ several light emitting chips so as to produce high light intensity, a problem arises in that the output consists of several approximate point light sources corresponding to the several chips. This pixelated spatial distribution of light is problematic for illumination applications.

Spectral light output quality can also be an issue when using light emitting diode packages for white illumination. For example, different applications may call for different color rendering index (CRI) values. Obtaining white light or substantially white light with a desired (usually high) CRI value in a commercially practical manner is difficult. Existing cost-effective "white" phosphor compositions sometimes have relatively low CRI values.

The present invention contemplates improved apparatuses and methods that overcome the above-mentioned limitations and others.

BRIEF SUMMARY

According to one aspect, a light emitting package is disclosed. A printed circuit board supports at least one light emitting die and has at least two electrical terminals. Printed circuitry of the printed circuit board connects the at least one light emitting die with the at least two electrical terminals to provide power thereto. A light transmissive cover is disposed over the at least one light emitting die but not over the at least two electrical terminals. The cover has an open end defining a cover perimeter connected with the printed circuit hoard. An inside surface of the cover together with the printed circuit board defines an interior volume containing the at least one light emitting die. An encapsulant is disposed in the interior volume and covers at least the light emitting die.

According to another aspect, a light emitting package is disclosed. A support has at least one light emitting die disposed thereon. A glass cover is disposed on the support over the at least one light emitting die. The glass cover and the support cooperatively define an interior volume containing the at least one light emitting die. An encapsulant is disposed in the interior volume and encapsulates the at least one light emitting die.

According to another aspect, a light emitting package is disclosed. A support has at least one light emitting die disposed thereon. A single piece light transmissive cover is disposed on the support over the at least one light emitting die. The single piece cover and the support cooperatively define a substantially closed interior volume containing the at least one light emitting die. An encapsulant is disposed in the interior volume and encapsulates the at least one light emitting die.

According to another aspect, a method is provided for making a light emitting package. At least one light emitting die is electrically and mechanically connected to a printed circuit board. A light transmissive cover is secured to the printed circuit board. The light transmissive cover covers the at least one light emitting die. The secured light transmissive cover and the printed circuit board cooperatively define an interior volume. An encapsulant is disposed in the interior volume.

According to another aspect, a method is provided for disposing of a phosphor on a surface. An adhesive is disposed on the surface. A phosphor powder is applied to the adhesive. The adhesive is hardened.

According to another aspect, a lighting package is disclosed. A printed circuit hoard supports at least one light emitting die. A light transmissive cover is disposed over the at least one light emitting die. At least one phosphor composition comprising at least one phosphor compound is disposed on or inside of the light transmissive cover. The at least one phosphor composition outputs converted light responsive to irradiation by the at least one light emitting die.

According to another aspect, a lighting package is disclosed. A printed circuit board supports at least one light emitting die. A light transmissive cover is disposed over the at least one light emitting die. An encapsulant substantially fills an interior volume defined by the light-transmissive cover and the printed circuit board.

According to another aspect, a lighting package is disclosed. A printed circuit board supports at least one light emitting die. A light transmissive cover is disposed over the at least one light emitting die. Electrical power-conditioning circuitry is disposed on the printed circuit board and is configured to condition received input power to energize the supported at least one light emitting die.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

In FIG. 8, a portion of the light transmissive cover is removed to show some of the light emitting dice or chips and other internal components.

In FIG. 9, a portion of the light transmissive cover removed to show internal elements of the lighting package.

In FIG. 11, a portion of the light transmissive cover removed to show internal elements of the lighting package.

FIG. 25 is a cross-sectional view of a lens for a blue LED source containing a band pass filter.

FIG. 26 is across-sectional view of a lens for a UV LED containing multiple band pass filters.

DETAILED DESCRIPTION OF PREFERRED EMBODIMENTS

Figure 1:
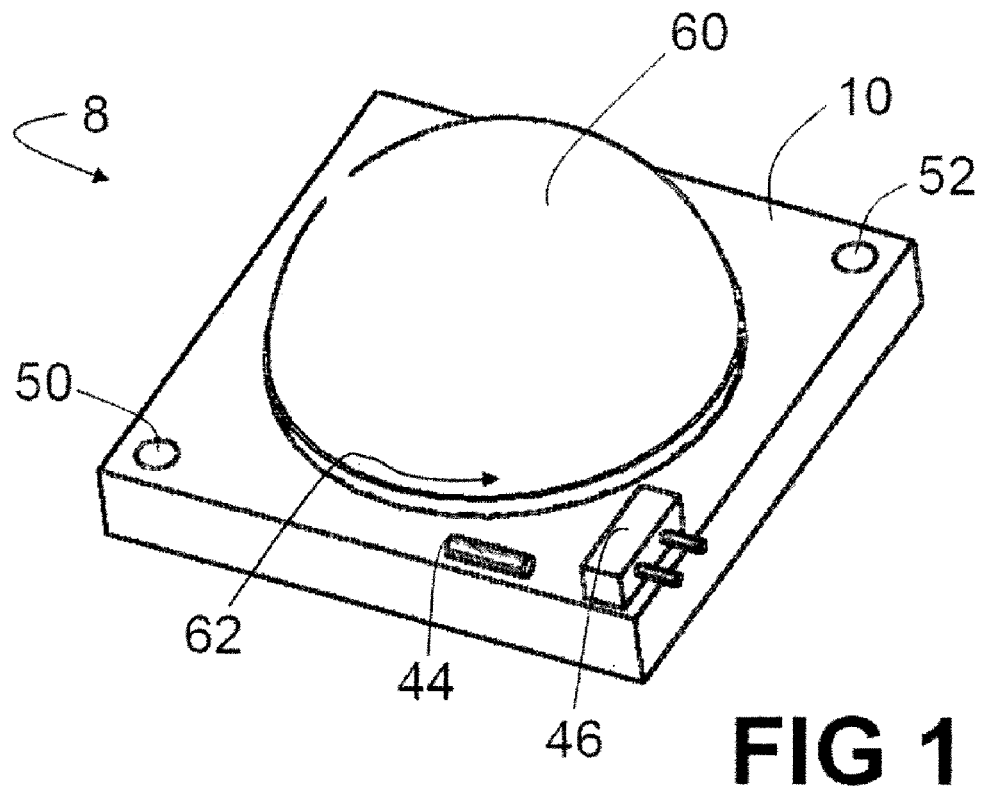
FIG. 1 shows a perspective view of a lighting component or package.
Figure 2:
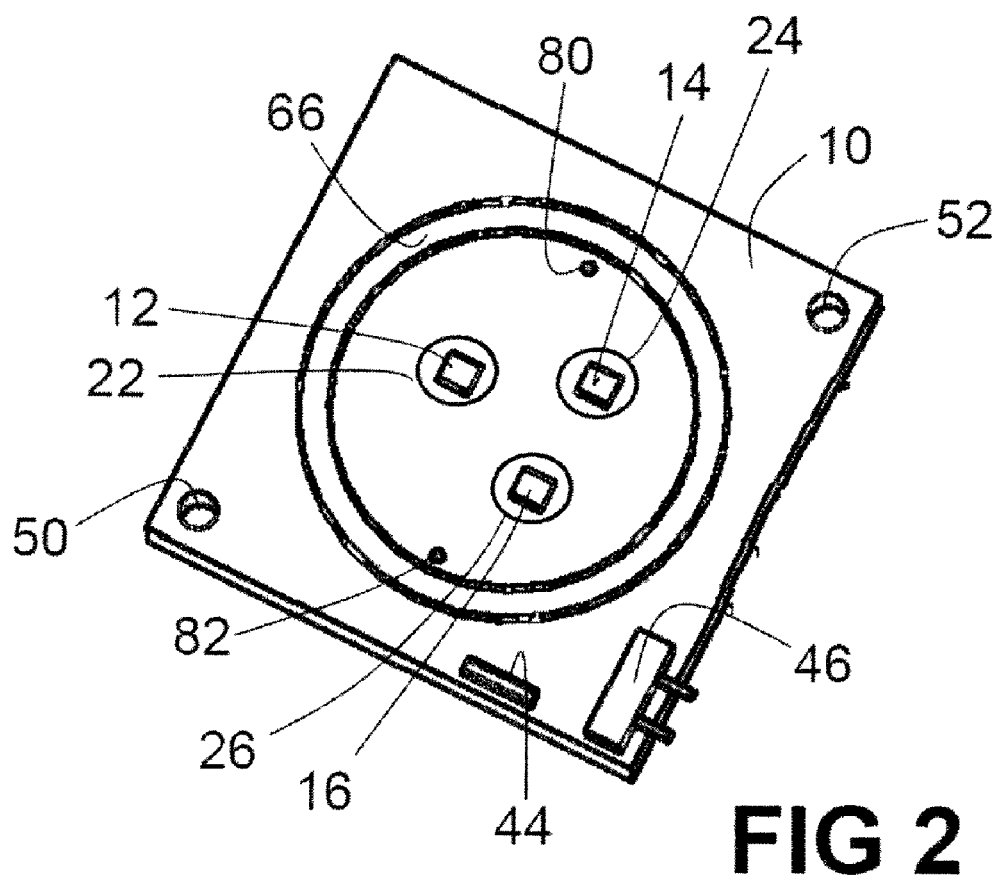
FIG. 2 shows a perspective view of the printed circuit board of the lighting package of FIG. 1 with the light emitting dice or chips and associated electrical components disposed thereon.
Figure 3:
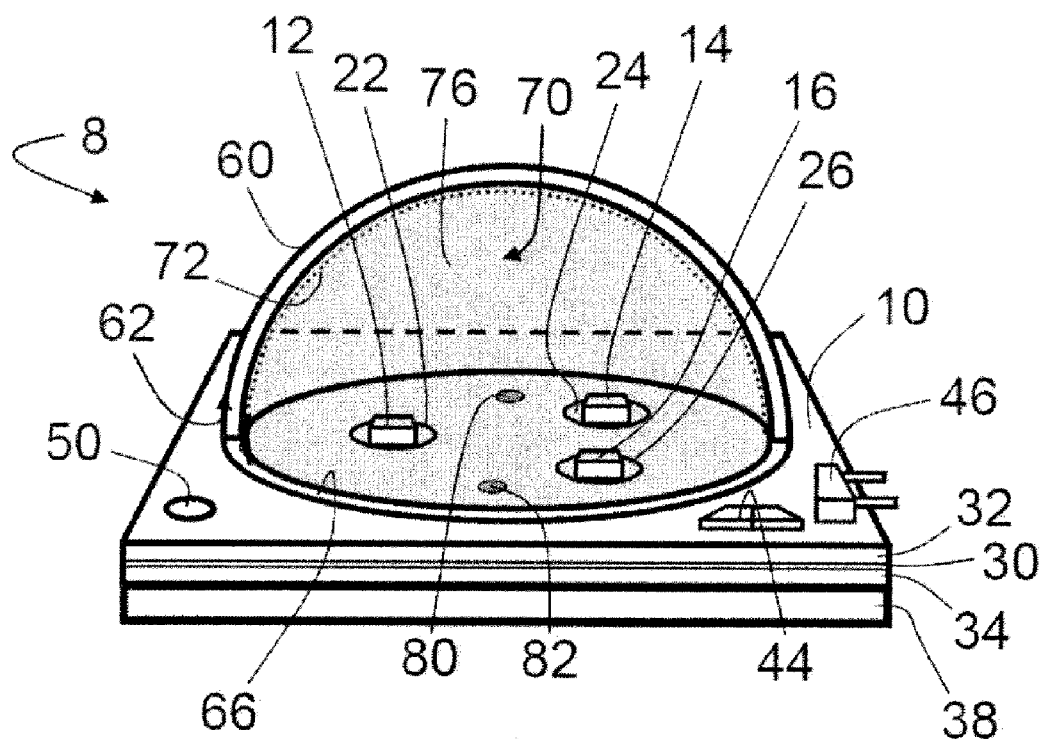
FIG. 3 shows a perspective view of the lighting component or package of FIG. 1 with a portion of the light transmissive cover removed to show internal elements of the lighting package.

With reference to FIGS. 1-3, a light emitting package 8 includes a printed circuit board 10 on which one or more light emitting chips or die are disposed. The printed circuit board is preferably substantially thermally conductive. For example, a metal core printed circuit board can be employed. In the illustrated embodiment, three light emitting chips or dice 12, 14, 16 are disposed on the circuit board 10; however, the number of dice can be one die, two dice, or more than three dice. The die or dice can be group III-nitride blue or ultraviolet light emitting diodes, red group III-phosphide or group III-arsenide light emitting diodes, II-VI light emitting diodes, IV-VI light emitting diodes, silicon or silicon-germanium light emitting diodes, or the like. As used herein, the term "ultraviolet" is intended to encompass light emitting diode emission having a peak wavelength less than or about 425 nm. In some contemplated embodiments, the die or dice are edge emitting lasers or vertical cavity surface emitting lasers. The light emitting chips or dice can also be organic light emitting diodes or devices. Each light emitting die or dice can be a bare die, or each die or dice can include an individual encapsulant. Still further, the die or dice can be a monolithic array of light emitting diode mesas, vertical cavity surface emitting laser mesas, or the like. In the illustrated embodiment, the dice 12, 14, 16 are disposed in corresponding reflective wells 22, 24, 26; however, the die or dice may be mounted on a planar surface of the printed circuit hoard 10 or can be mounted on raised pedestals or other elevated support structures. In some embodiments, a portion or all of the side of the printed circuit board 10 on which the light emitting dice or chips 12, 14, 16 are disposed has a reflective layer disposed thereon to improve light extraction from the package 8.

With particular reference to FIG. 3, the illustrated printed circuit board 10 includes one or more printed circuitry layers 30 sandwiched between insulative layers 32, 34. Typically, electrical pads are formed on the die attach surface of the printed circuit board 10 using appropriate vias passing through the insulative layer 32 to electrically connect the dice 12, 14, 16 with the printed circuitry 30. The die or dice 12, 14, 16 can be mechanically and electrically attached to the printed circuit board 10 in various ways, such as: by flip-chip bonding of die electrodes to electrical pads of the printed circuit board 10; by soldering the die to the hoard 10 and using wire bonds to electrically connect the die electrodes with electrical pads of the printed circuit hoard 10; by soldering the die to a lead frame (not shown) that is in turn mounted to the printed circuit board 10; or so forth. The die attachment can include a sub-mount (not shown) disposed between a light emitting die or chip and the printed circuit board or other support, or between the chip and a lead frame. In some embodiments, chip bonding is achieved using thermosonic bonding, thermocompressive bonding, ultrasonic bonding, eutectic bonding with or without underfill, or so forth. Still further, rather than mounting individual dice as illustrated herein, it is contemplated to employ a monolithic light emitting diode array formed on a common substrate. In this contemplated embodiment, the common substrate is soldered, thermosonically bonded, thermocompressively bonded, or otherwise secured to the printed circuit board 10, and electrical connection to the individual light emitting mesas or structures is made by wire bonding, conductive traces formed on the common substrate, or the like. Alternatively, a monolithic array having a transparent common substrate can be configured for a flip-chip mounting in which the electrodes of the light emitting mesas or structures are directly bonded to electrical pads.

The printed circuit board 10 preferably further includes a heat sinking structure such as a ground plate or metal core 38 to provide heat sinking of the light emitting chips or dice 12, 14, 16. Optionally, an insulative back-plate (not shown) is disposed on the side of the metal core 38 distal from the die attach surface. The heat sink is optionally omitted in lower power lighting packages, packages mounted on a heat sinking surface, or the like. Moreover, the printed circuitry layer or layers 30 may provide adequate heat sinking in some embodiments. In still yet other embodiments, the material or materials forming the insulative layers 32, 34 are chosen to be thermally conductive so that these layers provide heat sinking.

The printed circuit board 10 optionally supports associated electrical components, such as a zener diode component 44 including one or more zener diodes connected across the light emitting dice 12, 14, 16 by the printed circuitry 30 to provide electrostatic discharge protection for the dice. Similarly, electrical power conversion circuitry, power regulating circuitry, voltage stabilizing circuitry, current-limiting circuitry, rectifying circuitry, various combinations thereof, or the like, can be included as additional components on the printed circuit board 10. Such components can be provided as one or more discrete components, or as an application-specific integrated circuit (ASIC). Moreover, an electrical plug, adaptor, electrical terminals 46, or the like can be disposed on the printed circuit hoard 10. In some embodiments, it is contemplated to include more than one set of electrical terminals, for example to enable series, parallel, or series-parallel interconnection of a plurality of light emitting packages. The printed circuitry 30 includes traces connecting the electrical terminals 46 with the light emitting dice or chips 12, 14, 16 such that suitable electrical power applied to the electrical terminals 46 energizes the light emitting dice or chips 12, 14, 16 and associated circuitry (if any) such as the zener diode component 44, voltage stabilizing circuitry, current limiting circuitry, or so forth. The printed circuit board 10 can include other features such as a mounting socket, mounting openings 50, 52 or the like for mechanically installing or securing the light emitting package 8.

The described printed circuit board 10 is an example. Other types of printed circuit boards or other support structures can also be employed. For example, the printed circuit traces can be disposed on the die attach surface and/or on the bottom surface rather than being sandwiched between insulative layers 32, 34. Thus, for example, the printed circuit hoard can be an electrically insulating support with a conductive trace evaporated and patterned or otherwise formed on the insulating support. Moreover, a heat sink can be substituted for the printed circuit board, for example with the light emitting die or dice soldered or otherwise mechanically secured to the heat sink and with the die electrodes wire bonded to electrical pads.

With continuing reference to FIGS. 1-3, the light emitting package 8 further includes a light transmissive cover 60 disposed over the light emitting dice or chips 12, 14, 16. The light transmissive cover has an open end defining a cover perimeter 62 that connects with the printed circuit board 10. In the illustrated embodiment, the printed circuit board 10 includes an optional annular groove 66 that receives the perimeter 62 of the light transmissive cover 60, which in the light emitting package 8 is a hemispherical dome-shaped cover. The groove 66 guides in positioning the cover 60 on the printed circuit board 10, and optionally also is used to help secure the cover to the board. In some embodiments the annular groove 66 is omitted, in which case the placement of the cover 60 on the printed circuit board 10 is positioned by other means, such as by using an automated assembly jig.

The light transmissive cover 60 can be secured to the printed circuit hoard 10 in various ways, such as by an adhesive, by a friction fit between the perimeter 62 and the groove 66, by fasteners, or so forth. The light transmissive cover 60 together with the printed circuit board 10 define an interior volume 70 containing the light emitting dice or chips 12, 14, 16. In some embodiments, the connection between the perimeter 62 of the light transmissive cover 60 and the printed circuit board 10 is a substantially airtight sealing connection that substantially hermetically seals the interior volume 70. In other embodiments, the connection between the perimeter 62 and the printed circuit board 10 is not a hermetic seal, but rather may contain one or more gaps, openings, or the like.

A phosphor 72 (indicated by a dotted line in FIG. 3) is optionally disposed on an inside surface of the cover 60. If provided, the phosphor is selected to produce a desired wavelength conversion of a portion or substantially all of the light produced by the light emitting dice or chips 12, 14, 16. The term "phosphor" is to be understood as including a single phosphor compound or a phosphor blend or composition of two or more phosphor compounds chosen to produce a selected wavelength conversion. For example, the phosphor 72 may be a phosphor composition including red, green, and blue phosphor compounds that cooperatively provide white or substantially white light. In some embodiments, the tri-phosphor blend of $(Ba,Sr,Ca)_5(PO_4)_3Cl:Eu^{2+}$, $Sr_4Al_{14}O_{25}:Eu^{2+}$, and $3.5MgO*0.5MgF_2*GeO_2:Mn^{4+}$ phosphors is used. In some embodiments, the phosphor compound $(Ca,Sr,Ba)_2Si_{1-c}O_{4-2c}:Eu^{2+}$ where $0 \leq c<0.25$ is used alone or in combination with other phosphor compounds, and the phosphor is excited by a light emitting diode die or chip emitting radiation having a peak emission from about 200 nm to about 500 nm. In some embodiments, the phosphor composition includes phosphor compounds $(Ca,Sr,Ba)Al_2O_4:Eu^{2+}$, $Sr_4Al_{14}O_{25}:Eu^{2+}$, and $(Ca,Sr,Ba)MgAl_{10}O_{17}:Eu^{2+},Mn^{2+}$. For purposes of the present application, it should be understood that when a phosphor has two or more dopant ions (i.e. those ions following the colon in the above compositions), this is meant to mean that the phosphor has at least one (but not necessarily all) of those dopant ions within the material. That is, as understood by those skilled in the art, this type of notation means that the phosphor can include any or all of those specified ions as dopants in the formulation. In some embodiments, the phosphor blend is selected to provide white light with color coordinates lying on or near the blackbody locus and a color temperature less than 4500K. In some embodiments, the phosphor blend is selected to provide white light with color coordinates lying on or near the blackbody locus and a color rendering index ($R_a$) of 90 or greater.

Some various suitable phosphor compounds that can be used alone as a single-compound phosphor composition and/ or in combination with other phosphor compounds as a multiple-compound phosphor composition are listed here:

$(Mg,Ca,Sr,Ba,Zn)_5(PO_4)_3Cl:Eu^{2+}$
$(Ca,Sr,Ba)_2Si_{1-c}O_{4-2c}:Eu^{2+}$ where $0 \leq c<0.25$
$(Ba,Sr,Ca)_5(PO_4)_3(Cl,F,Br,OH):Sb^{3+},Mn^{2+}$
$(Mg,Ca,Sr,Ba,Zn)_5(PO_4)_3(F,Cl,Br,OH):Eu^{2+},Mn^{2+}$
$(Ba,Sr,Ca)BPO_5:Eu^{2+},Mn^{2+}$
$(Sr,Ca)_{10}(PO_4)_6*nB_2O_3:Eu^{2+}$
$Sr_2Si_3O_8*2SrCl_2:Eu^{2+}$
$Sr_4Al_{14}O_{25}:Eu^{2+}$
$(Ca,Sr,Ba)MgAl_{10}O_{17}:Eu^{2+},Mn^{2+}$
$Ba_3MgSi_2O_8:Eu^{2+}$
$BaAl_8O_{13}:Eu^{2+}$
$2SrO*0.84P_2O_5*0.16B_2O_3:Eu^{2+}$,
$(Ba,Sr,Ca)Al_2O_4:Eu^{2+}$
$(Y,Gd,Lu,Sc,La)BO_3:Ce^{3+},Tb^{3+}$
$Ca_8Mg(SiO_4)_4Cl_2:Eu^{2+},Mn^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Al,Ga)_{5-f}O_{12-3/2f}:Ce^{3+}$ (wherein $0 \leq f \leq 0.5$)
$(Lu,Y,Sc)_{2-g}(Ca,Mg)_{1+g}Li_hMg_{2-h}(Si,Ge)_{3-h}P_hO_{12-g}:Ce^{3+}$ (wherein $0 \leq g \leq 0.5$, $0 \leq h \leq 0.5$)
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Ca,Sr,Ba,Mg,Zn)_{10}(PO_4)_6(F,Cl,Br,OH)_2:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$SrY_2S_4:Eu^{2+}$
$CaLa_2S_4:Ce^{3+}$
$(Ca,Sr)S:Eu^{2+}$
$(Ba,Sr,Ca)MgP_2O_7:Eu^{2+},Mn^{2+}$
$(Y,Lu)_2WO_6:Eu^{3+},Mo^{6+}$
$(Ba,Sr,Ca)_uSi_v(N,O)_w:Eu^{2+}$
$(Lu,Ca,Li,Mg,Y)$alpha-SiAlON doped with $Eu^{2+}$ and/or $Ce^{3+}$
$(Y,Lu,Gd)_{2-t}Ca_tSi_4N_{6+t}C_{1-t}:Ce^{3+}$ (wherein $0 \leq t \leq 0.5$)
$3.5MgO*0.5MgF_2*GeO_2:Mn^{4+}$
$A_2[MF_6]:Mn^{4+}$, where A=Li, Na, K, Rb or Cs and M=Ge, Si, Sn, Ti or Zr
$Ca_{1-d-e}Ce_dEu_eAl_{1-d}(Mg,Zn)_dSiN_3$.

Those skilled in the art can readily select other phosphor compounds suitable for performing specific light conversions.

It should be noted that various phosphors are described herein in which different elements enclosed in parentheses and separated by commas, such as in the above $Ca_{1-d-e}Ce_dEu_eAl_{1-d}(Mg,Zn)_dSiN_3$ phosphor. As understood by those skilled in the art, this type of notation means that the phosphor can include any or all of those specified elements in the formulation in any ratio from 0 to 100%. That is, this type of notation, for the above phosphor for example, has the same meaning as $Ca_{1-d-e}Ce_dEu_eAl_{1-d}(Mg_{1-q}Zn_q)_dSiN_3$, wherein $0 \leq q \leq 1$.

In some embodiments, a phosphor composition including phosphor compounds $Sr_4Al_{14}O_{25}:Eu^{2+}$ and $(Ca,Sr,Ba)MgAl_{10}O_{17}:Eu^{2+},Mn^{2+}$ are employed to produce a green light suitable for use in application such as traffic signals. Similarly, other listed phosphors are also suitable for producing saturated colors and/or as phosphor compound components in white phosphor compositions.

In one embodiment, the light emitting dice or chips 12, 14, 16 are blue, violet, or ultraviolet emitters such as group III-nitride light emitting diodes, and the phosphor 72 converts most or substantially all of the light generated by the chips 12, 14, 16 into white light. In another embodiment the light emitting dice or chips 12, 14, 16 are blue light emitters such as group III-nitride light emitting diodes, and the phosphor 72 is a yellow phosphor that converts some of the blue light into yellow light wherein direct blue light and indirect yellow phosphor-generated light combine to produce white light. In yet another embodiment the light emitting dice or chips 12, 14, 16 are blue, violet, or ultraviolet emitters and the phosphor 72 converts most or substantially all of the emitted light into light of a selected color, such as green, yellow, red, or so forth, so that the light emitting package 8 produces a colored light. These are examples only, and substantially any down-conversion of light produced by the light emitting dice or chips 12, 14, 16 can be performed by suitable selection of light emitting dice or chips 12, 14, 16 outputting at a selected wavelength and suitable selection of the phosphor 72. In some embodiments, the phosphor 72 is omitted and the direct light produced by the light emitting diodes 12, 14, 16 is the light output of the light emitting package.

In some embodiments, the light transmissive cover 60 is a glass cover, where "glass" is not limited to silica-based materials but rather encompasses substantially any inorganic, amorphous light transmissive material. Making the cover 60 of glass has certain advantages over plastic or other organic covers. Glass typically has better thermal stability than most plastics. Glass is more readily coated with optical coatings such as wavelength-selective reflective coatings, wavelength-selective absorbing coatings, or the like. Glass is also typically more resistant to scratching compared with most plastics. Moreover, glass has particular advantages in embodiments in which the light emitting dice or chips 12, 14, 16 produce ultraviolet or short-wavelength visible light, because light at these wavelengths can discolor or otherwise degrade the optical quality of light transmissive plastics over time. Optionally, a glass is selected which provides high reflectivity or absorption in the ultraviolet. In other embodiments, the light transmissive cover 60 is made of plastic, Teflon, epoxy, EVA, acrylic, or another organic light transmissive material. In yet other contemplated embodiments, the cover 60 is made of a crystalline light transmissive material such as crystalline quartz. Such crystalline covers typically share many of the advantages of glass covers.

The printed circuit board 10 can include various reflective coatings or reflective surfaces for improving light extraction efficiency. In some embodiments, substantially the entire surface of the printed circuit board on which the light emitting dice or chips 12, 14, 16 and the cover 60 are disposed is reflective for both light produced by the light emitting chips and for light produced by the phosphor 72. In other embodiments, that portion or area of the printed circuit board surface covered by the cover 60 is reflective for both light produced by the light emitting chips and for light produced by the phosphor 72, while that portion or area of the printed circuit board surface outside of the cover 60 is reflective principally for light produced by the phosphor 72. These latter embodiments are suitable when substantially all of the direct light produced by the light emitting dice or chips 12, 14, 16 is converted by the phosphor, so that the output light is substantially entirely due to the phosphor. By using different reflective coatings or surfaces inside of and outside of the cover 60, each reflective coating or surface can be independently optimized for the spectrum of light which it is intended to reflect.

It will be appreciated that the term "light transmissive" as used herein to describe the cover 60 refers to the desired light output produced by the light emitting package 8. The light output includes light generated by the phosphor 72, if present, responsive to irradiation by the light emitting dice or chips 12, 14, 16. In some embodiments, the light output includes a portion or all of the direct light produced by the light emitting dice or chips 12, 14, 16. Examples of the latter embodiments are a white light in which the white output light is a blending of blue light emitted by the light emitting dice or chips 12, 14, 16 and yellow light emitted by the phosphor 72, or embodiments in which the phosphor 72 is omitted entirely. Where the direct light produced by the light emitting dice or chips 12, 14, 16 contributes to the output light, the cover 60 should be at least partially light transmissive for that direct light. In embodiments where the output light is solely produced by the phosphor 72, on the other hand, the cover 60 may be light transmissive for the phosphor output but partially or wholly reflective or absorbing for the direct light produced by the light emitting dice or chips 12, 14, 16.

An example of such a light emitting package is a white light emitting package in which the output white light is produced by the phosphor 72 responsive to ultraviolet light produced by the light emitting dice or chips 12, 14, 16. The term "ultraviolet" is intended to encompass light produced by the light emitting dice or chips 12, 14, 16 whose peak wavelength is less than or about 425 nm. In such embodiments, including both an ultraviolet-reflective coating on the cover 60 and an ultraviolet-reflective coating on the printed circuit board 10 can effectively retain ultraviolet light produced by the ultraviolet light emitting diodes within the interior volume 70 so that the ultraviolet light has multiple opportunities through multiple reflections to interact with the phosphor 72, thus enhancing the ultraviolet-to-white light conversion efficiency. For retaining light, disposing the ultraviolet reflective coating on the inside of the cover 60 is advantageous to avoid ultraviolet absorption losses in the cover 60. Alternatively, the ultraviolet reflecting coating can be disposed on the outside of the cover 60, or as an embedded layer or thin region within the cover 60.

The phosphor 72 can be applied to the inside surface of the light transmissive cover 60 using a suitable phosphor coating process, such as for example, electrostatic coating, slurry coating, spray coating, or so forth. Moreover, the phosphor can be disposed elsewhere besides on the inside surface of the cover 60. For example, the phosphor can be applied to the outside surface of the cover 60, using for example spray coating, outer surface coating, or the like, or to both the inside and outside surfaces of the cover 60. In yet another embodiment, the phosphor is embedded in the material of the light transmissive cover 60. However, phosphor is not readily embedded into most glass or crystalline materials. In some embodiments the phosphor is disposed in a glass binder that is spun onto or otherwise coated onto the inside and/or outside surface of the cover 60.

In one suitable phosphor application process, the inside surface of the cover 60 is prepared by treatment with a liquid or low viscosity semi-solid material acting as a glue. The liquid material can be, for example, liquid epoxy or silicone. The glue material can be applied in a variety of ways, such as by spraying, brushing, or dipping of its working formulation or a solution thereof in a suitable solvent such as acetone, methyl isobutyl ketone (MIBK), or t-butyl acetate. The phosphor is then deposited by dusting, dipping or pouring of phosphor in powder form, the choice of deposition method being based on the nature of the inside surface of the cover 60. For example, pour phosphor powder is suitably poured into the concave inside surface of the cover 60. On the other hand, dipping is generally a better method for coating the outside surface of the cover 60. The glue is then hardened by solvent evaporation, thermal or UV curing, or the like to form the phosphor layer.

Repetitions or various combinations of the above-described example phosphor deposition and hardening processes may be performed, for example to deposit more than one layer of phosphor or multiple layers of phosphor blends, or as needed to attain a required thickness or layered phosphor structure. Optionally, the phosphor coating may be covered with a final layer of clear glue or other suitable material to provide mechanical protection, to filter out ambient ultraviolet light or excess radiation from the light emitting dice 12, 14, 16, or so forth.

As noted previously, the light transmissive cover 60 optionally includes one or more optical coatings besides the phosphor 72. In some embodiments, an anti-reflective coating is applied to the inside and/or outside surface of the cover 60 to promote light transmission. In embodiments in which the direct light produced by the light emitting dice or chips 12, 14, 16 does not form part of the output light, the light transmissive cover 60 optionally includes a wavelength-selective reflective coating to reflect the direct light back into the interior volume 70 where it has additional opportunity to interact with the phosphor 72.

In preferred embodiments, the light transmissive cover 60 is a single piece cover, such as a single piece glass cover, a single piece molded plastic cover, or the like. Manufacturing the cover 60 as a single piece simplifies assembly of the lighting package 8. Another advantage of a single piece cover 60 is that a substantially hermetic sealing of the interior volume 70 is obtained by ensuring a substantially hermetic seal between the perimeter 62 of the cover 60 and the printed circuit board 10. The light transmissive cover 60 can include facets, fresnel lens contours, or other light refractive features that promote light scattering to produce a more spatially uniform light output. Similarly, the light transmissive cover 60 can be made of a frosted glass that has been etched with sand or the like to produce light scattering. Optionally, the cover 60 includes an anti-shatter coating such as CovRguard™ (available from General Electric Company, GE Lighting Division, Nela Park, Cleveland, Ohio), Teflon, urethane, vinyl, or so forth.

With particular reference to FIG. 3, the interior volume 70 is, in the lighting package 8, substantially filled with an encapsulant 76. The encapsulant 76 can be, for example, a silicone encapsulant, an epoxy encapsulant, or the like. The encapsulant 76 is at least partially light-transmissive or substantially transparent to light produced by the light emitting dice or chips 12, 14, 16 and acts as a refractive index-matching material promoting light extraction out of the light emitting dice or chips 12, 14, 16, and preferably also promoting light coupling with the phosphor 72 and, if the direct light produced by the light emitting dice 12, 14, 16 directly contributes to the package light output, also preferably promotes light transmission into the cover 60.

In some embodiments, the phosphor is dispersed in a binding material that is the same material as the encapsulant 76. In other embodiments the phosphor-binding material is a different material that has a good refractive index match with the encapsulant 76. In yet other embodiments, the encapsulant 76 serves as the binding material for the phosphor 72. It will be appreciated that while the phosphor 72 is shown in FIG. 3 as residing substantially along the inside surface of the cover 60, in some embodiments the phosphor 72 may extend some distance away from the inside surface of the cover 60 and into the encapsulant 76 disposed in the interior volume 70. In some contemplated embodiments, the phosphor is dispersed substantially into the encapsulant 76, and may even be uniformly distributed throughout the encapsulant 76. However, as described in International Publication WO 2004/021461 A2, there are efficiency advantages to spatially separating the phosphor from the light emitting dice or chips. Hence, in preferred embodiments the phosphor is disposed on the inside surface of the cover 60, or is disposed closer to the cover 60 than to the light emitting dice or chips 12, 14, 16. In some embodiments, light-scattering particles, particulates, or so forth are dispersed in the encapsulant 76 to provide more uniform light distribution.

In embodiments in which the light emitting dice or chips 12, 14, 16 are bare dice, that is, are not individually encapsulated, the encapsulant 76 provides a common encapsulation of the light emitting dice or chips 12, 14, 16 which protects the chips from damage due to exposure to moisture or other detrimental environmental effects. The encapsulant 76 may also provide potting of the light emitting dice or chips 12, 14, 16 to improve the robustness of the lighting package 8 and make the lighting package 8 more resistant to damage from vibrations or other mechanical disturbances.

In some embodiments the cover 60 is sealed to the printed circuit board 10, and the encapsulant 76 is injected into the interior volume 70 after the light transmissive cover is sealed. To enable encapsulant injection, openings 80, 82 are provided in the printed circuit board 10 Alternatively, openings can be provided in the light transmissive cover or at the interface between the perimeter of the cover and the printed circuit board. At least two such openings 80, 82 are preferably provided, so that while encapsulant material is injected into one opening displaced air can exit via another opening. In other embodiments, a single elongated or otherwise enlarged opening is used to provide room for both the inflowing encapsulant and the outflowing displaced air.

In embodiments in which the interior volume 70 is substantially hermetically sealed, the injected encapsulant 76 can be a liquid or non-rigid semi-solid encapsulant, such as an optical gel, that is contained by the hermetically sealed interior volume 70. The liquid or non-rigid semi-solid encapsulant may be left uncured in some embodiments, since the hermetic seal prevents leakage of the encapsulant. Moreover, a hermetic seal optionally allows the encapsulant to be injected under some pressure, so that the encapsulant is at a pressure higher than atmospheric pressure. In some embodiments, the interior volume 70 is not hermetically sealed, and some of the injected encapsulant material may leak out. It will be appreciated that for encapsulant material of reasonably high viscosity, the amount of leaked encapsulant material is limited, and such leaked encapsulant material may even be advantageous insofar as it may help seal the interior volume 70 when the injected encapsulant is cured or otherwise hardened into a solid.

Figure 4:
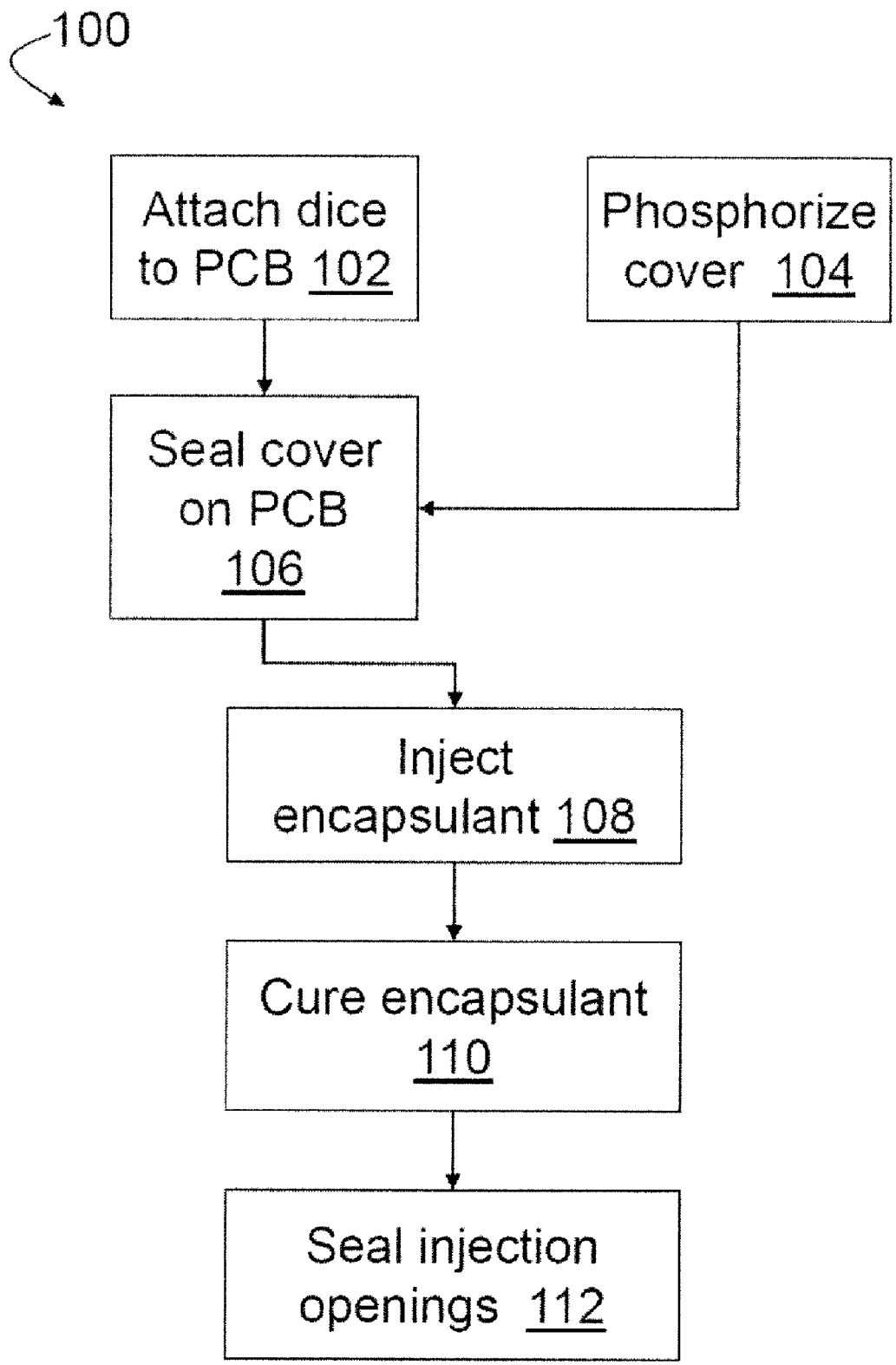
FIG. 4 diagrams an example process for manufacturing the lighting package of FIG. 1.

With continuing reference to FIGS. 1-3 and with further reference to FIG. 4, an example process 100 for manufacturing the lighting package 8 is described. The light emitting dice or chips 12, 14, 16 are mechanically and electrically connected with the printed circuit board 10 in a die attach process 102. The die attach can involve flip chip bonding, soldering, wire bonding, or so forth. Separately, the inside surface (and/or optionally the outside surface) of the light transmissive cover 60 is coated with the phosphor 72, if such phosphor is included in the package 8, in a phosphorizing process 104. As used herein, the term "phosphorizing" denotes any method for putting a phosphor into the lighting package, such as coating or spraying a phosphor composition or compositions onto the light-transmissive cover, suspending phosphor particles in the encapsulant, embedding a phosphor in the light-transmissive cover, or so forth. In embodiments in which the cover has the phosphor embedded therein, the phosphorizing process 104 is omitted and instead the phosphor is incorporated during molding or other formation of the cover 60. The cover is then secured, optionally sealed, to the printed circuit board 10 in a sealing process 106. The sealing process 106 defines the interior volume 70, which is optionally a hermetically sealed volume. The encapsulant 76 is then injected into the interior volume 70 through the openings 80, 82 in an encapsulant injection process 108. The encapsulant is cured in a curing process 110 if the encapsulant material requires curing. After injection and optional curing of the encapsulant 76, the openings 80, 82 are optionally sealed with a suitable sealing material in a sealing process 112. In some embodiments, the encapsulant 76 also seals the openings 80, 82, and so in these embodiments the separate sealing process 112 is omitted.

Figure 5:
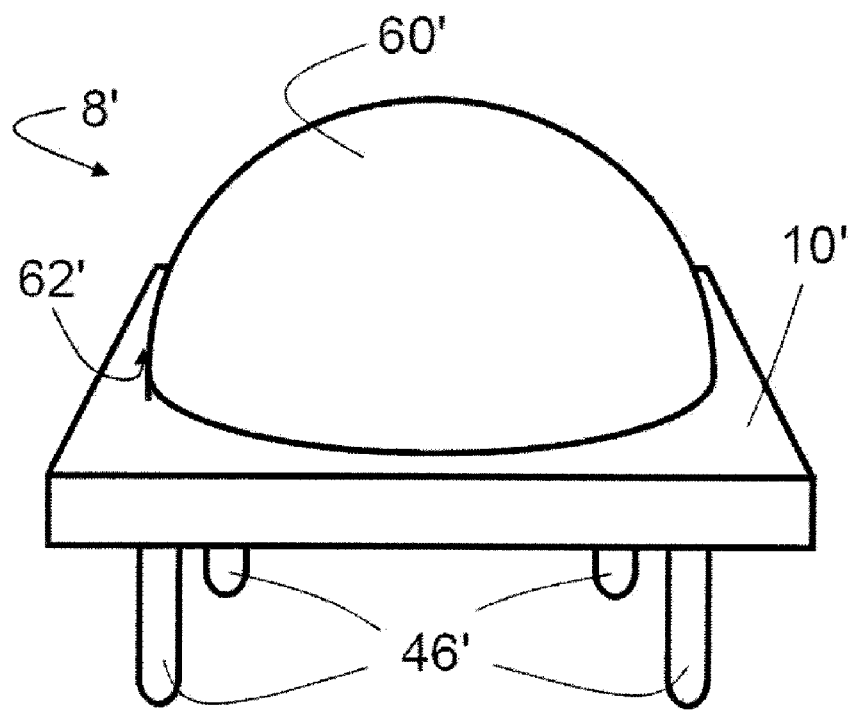
FIG. 5 shows a perspective view of another lighting component or package having backside electrical terminals.

With reference to FIG. 5, another lighting package 8' includes a printed circuit board 10' and a light transmissive cover 60' having an open end defining a cover perimeter 62', which are illustrated in FIG. 5 and correspond to the printed circuit board 10, cover 60, and cover perimeter 62', respectively, of the lighting package 8. The lighting package 8' also includes most other components of the lighting package 8 which however are not visible in the outside perspective view of FIG. 5. The lighting package 8' differs from the lighting package 8 of FIGS. 1-3 in that the electrical terminals 46 of the lighting package 8 are replaced in the lighting package 8' by four electrical terminals 46' disposed on the backside of the printed circuit board 10'. The electrical terminals 46' are electrically connected with the light emitting die or dice disposed in the cover 60' by suitable printed circuitry residing in or on the printed circuit board 10'. The backside electrical terminals 46' can be configured, for example, to insert into matching openings of a four-prong surface-mount receptacle socket.

With returning reference to FIGS. 1-3, in some embodiments the phosphor composition 72 includes a mixture of at least two constituent phosphor compositions each possessing essentially the same emission color coordinates (for example x and y coordinates on the 1931 CIE chromaticity diagram) but different color rendering index (CRI) values. The at least two different constituent phosphor compositions are different in that they differ by at least one phosphor compound. For example, the first constituent phosphor composition may include blue, green, and yellow phosphor compounds A, B, and C, respectively, with a stoichiometry producing white or substantially white light at a first CRI value; the second constituent phosphor composition may include green, yellow, and red phosphor compounds B, C, and D, respectively, with a stoichiometry producing white or substantially white light at a second, different CRI value. In some embodiments, the blue, green, yellow, and red phosphor compounds A, B, C, and D are respectively $(Ba,Sr,Ca)_5(PO_4)_3Cl:Eu^{2+}$, $Sr_4Al_{14}O_{25}:Eu^{2+}$, $(Ca,Sr,Ba)_2Si_{1-c}O_{4-2c}:Eu^{2+}$ where $0 \leq c < 0.25$, and $3.5MgO*0.5MgF_2*GeO_2:Mn^{4+}$. The output converted light consisting of a blending of the constituent converted light of the first and second phosphor compositions has a CRI value that is different from, and possibly larger than, the first or second CRI value of the individual constituent phosphor compositions.

Figure 6:
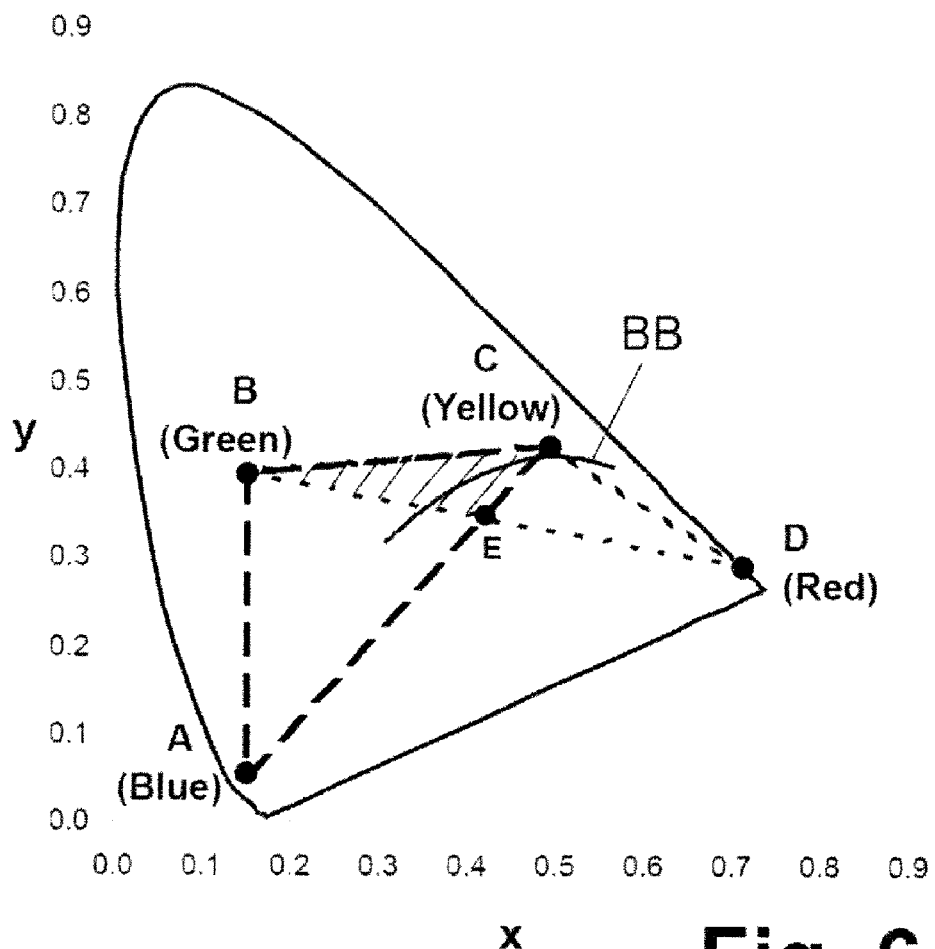
FIG. 6 shows CRI tuning using a first phosphor composition having phosphor compounds (A,B,C) and a second phosphor composition having phosphor compounds (B,C,D).

With reference to FIG. 6, which plots the 1931 CIE diagram with the blackbody locus BB superimposed thereon, the first phosphor composition (A,B,C) can have stoichiometries whose color coordinates span a triangle having as vertices the color points of the phosphor compounds A, B, and C. The second phosphor composition (B,C,D) can have stoichiometries whose color coordinates span a triangle having as vertices the color points of the phosphor compounds B, C, and D.

A cross-hatched triangle having as vertices the color points of the common phosphor compounds B and C and a third vertex E denote the range of color coordinates that can be achieved using suitable stoichiometries of either phosphor composition (A,B,C) or phosphor composition (B,C,D). In this range, CRI tuning and/or luminosity tuning is achievable by blending or combining the first and second phosphor compositions with stoichiometries corresponding to about the same color point. This approach enables CRI tuning by selecting the ratio of the first (A,B,C) constituent phosphor composition and second (B,C,D) constituent phosphor composition. More generally, at any given color point target, at least two constituent phosphor compositions are prepared, each constituent phosphor composition producing constituent converted light at substantially the same color point responsive to irradiation by emission of the light emitting die or chip 612 (preferably but not necessarily in the ultraviolet range, such as peak chip emission wavelength less than or about 425 nm). The number of phosphor compounds per constituent phosphor composition can be anywhere from one (such as, for example, suitable phosphor compounds disclosed in U.S. Pat. No. 6,522,065) to two, three or more (such as, for example, suitable phosphor blends disclosed in U.S. Pat. No. 6,685, 852). The disclosures of U.S. Pat. Nos. 6,522,065 and 6,685, 852 are incorporated by reference herein in their entirety. To minimize color point variation, the at least two different constituent phosphor compositions should preferably provide substantially the same color point when excited by emission of the light emitting die or chip 612, preferably to within about 0.020 units in both x and y color coordinates on the 1931 CIE chromaticity diagram, more preferably to within 0.010 units, and still more preferably to within 0.005 units. In some embodiments, the amount of the two constituent phosphor compositions relative to each other is selected to optimize the light output respective to color rendering index (CRI) at a given minimal luminosity threshold, or vice versa, at a selected color point.

By varying the ratio or blending of two or more constituent phosphor compositions of substantially the same color point but different CRI values, one can alter the final CRI and luminosity characteristics of the device in a continuous fashion. By using a mixture of the constituent phosphor compositions, a continuous range of CRI values are achievable. For some such mixtures, the CRI value of the blended light may be larger than the CRI value of any of the constituent phosphor compositions acting alone. Advantageously, the CRI (e.g. maximize it for a given minimal luminosity requirement) or the luminosity (e.g. maximize it for a given minimal CRI requirement) of the lighting device 608 is tunable without affecting the chemical makeup of either the phosphor compounds or the constituent phosphor compositions configured for the color point target. This affords a set of at least two constituent phosphor compositions to be used for the manufacturing of light sources with the same or similar color point but with CRI or luminosity values customized for specific applications. Some suitable approaches for optimizing or selecting the CRI using two or more constituent phosphor compositions having about the same color coordinates are disclosed in co-pending application Ser. No. 10/909,564 filed Nov. 2, 2004 which is incorporated by reference herein in its entirety. In some embodiments, the at least two different constituent phosphor compositions are selected to provide white light with color coordinates lying on or near the blackbody locus and a color temperature less than 4500K.

Figure 7:
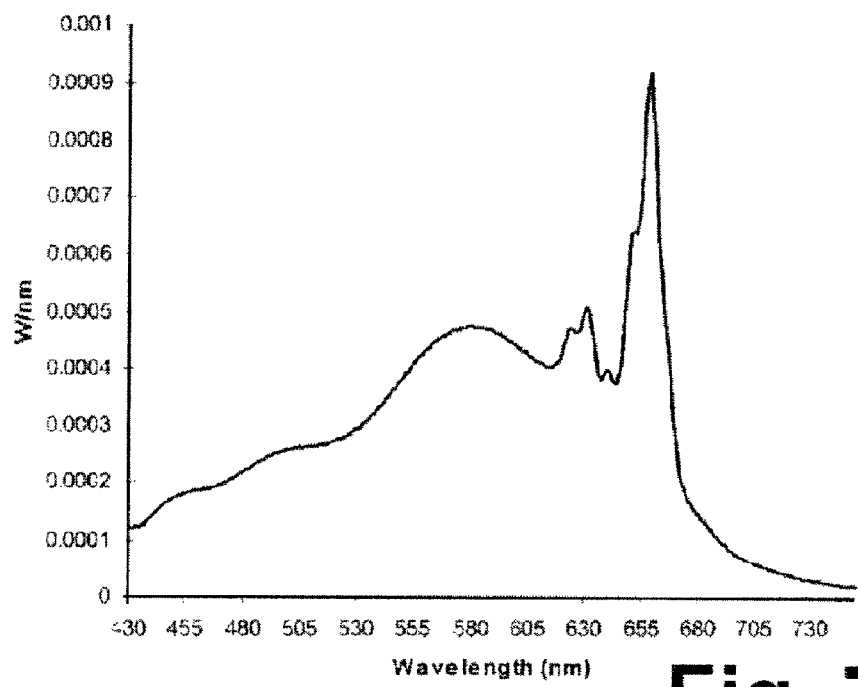
FIG. 7 shows a high CRI spectrum achievable using the CRI tuning of FIG. 6.

With reference to FIG. 7, in some embodiments, the at least two different constituent phosphor compositions are selected to blend to produce white light with a color rendering index ($R_a$) of 90 or greater. Example FIG. 7 shows a CRI-tuned converted light spectrum using a mixture of the aforementioned (A,B,C) and (B,C,D) phosphor compositions that provided a correlated color temperature of about 3300K and a CRI value of about 90. When the blue or bluish bleed-through direct light emitting die radiation blending with the converted light spectrum of FIG. 7 is also accounted for, the color temperature was about 3500K and the CRI value was about 91. Higher or lower CRI values are attainable at the same color point or another color point attainable by both phosphor compositions by varying the ratio of the phosphor compositions, by using a technique such as Design of Experiment (DOE).

It is to be appreciated that the CRI-tuning mixture of phosphor compositions (A,B,C) and (B,C,D) is an example. Other mixtures can be used so long as the constituent phosphor compositions produce converted light at about the same color point of interest. In some CRI tuned embodiments, the constituent phosphor compositions each produce constituent converted light which is white light or substantially white light, that is, which lies on or substantially on the black body locus of the 1931 CIE chromaticity diagram. Such constituent phosphor compositions are suitably operated in conjunction with one or more ultraviolet light emitting chips or dice, that is, with chips or dice that emit peak radiation below or about at 425 nm. In these embodiments, the bleed-through light produced by the at least one light emitting die has a negligible contribution to the visible spectrum of the converted light of the different phosphor compositions blended with bleed-through light produced by the at least one light emitting die. This negligible contribution can result from an arrangement in which the conversion efficiency of the light produced by the at least one light emitting die is close to 100%. This negligible contribution can also result from the at least one light emitting die emitting light substantially outside of the visible spectrum.

In other CRI tuned embodiments, the output converted light produced by blending of the constituent converted light of the constituent phosphor compositions combined with radiation produced by the at least one light emitting die that bleeds through the phosphor layer 72 to contribute to light output of the light emitting package 8 is white light or substantially white light, that is, lies on or substantially on the black body locus of the 1931 CIE chromaticity diagram. In some such embodiments, the phosphor compositions have color points corresponding to yellowish or orangish light and are suitably operated in conjunction with one or more blue light emitting chips or dice, that is, with chips or dice that emit peak radiation in the blue or bluish visible range. The bleed-through blue or bluish light combines with the yellowish or orangish converted light to provide white light output of the light emitting package. In other such embodiments, the phosphor compositions produce white or substantially white light with low intensity in the blue or bluish range, and the one or more light emitting chips or dice emit peak radiation in the blue or bluish visible range that bolsters the spectrum of the blended light in the blue or bluish range of the visible spectrum.

Figure 8:
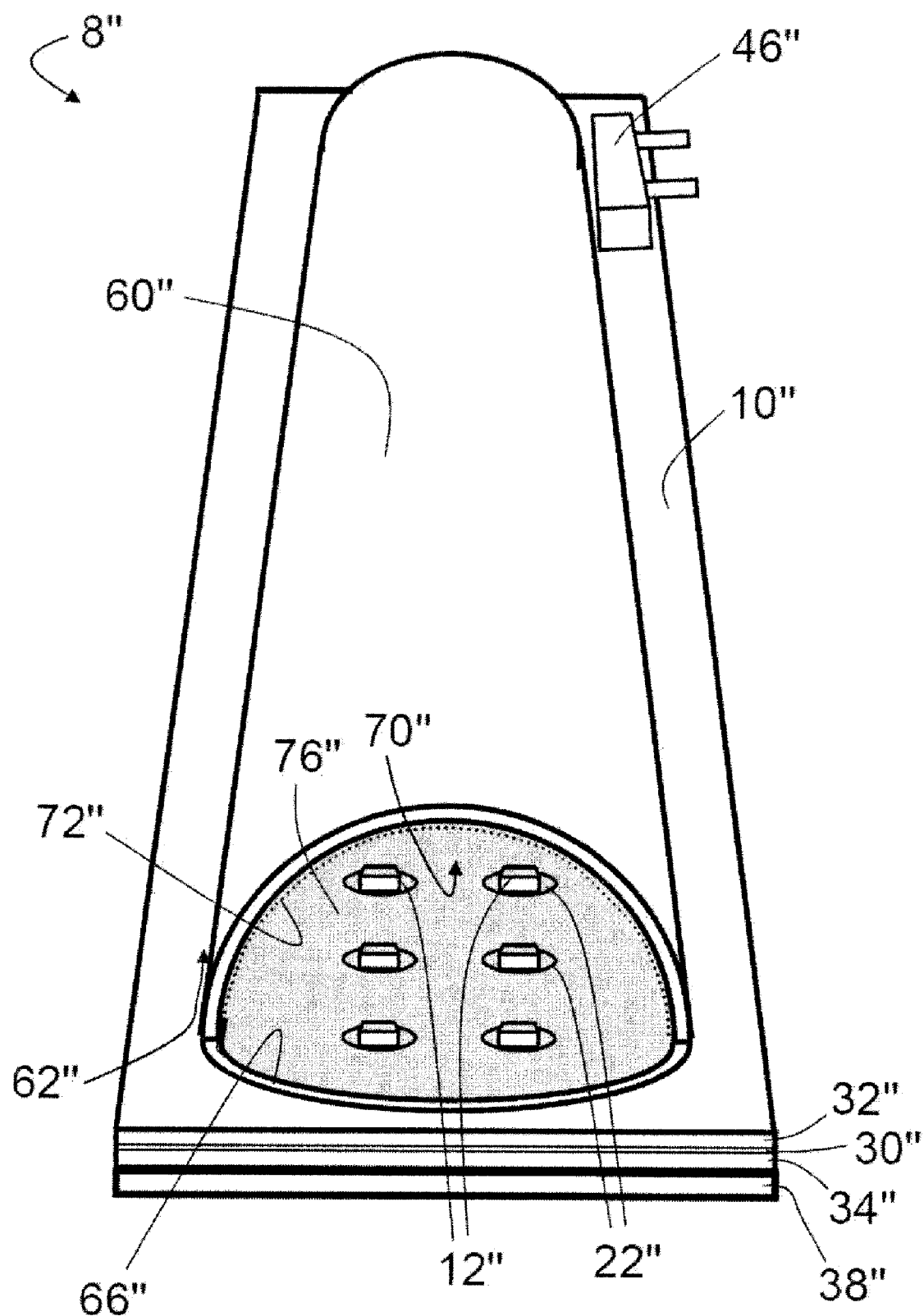
FIG. 8 shows a perspective view of another lighting component or package having light emitting chips arranged in a long double-row.

With reference to FIG. 8, another lighting package 8" includes a printed circuit board 10", having a long strip shape, on which a plurality of light emitting dice or chips 12" are arranged in reflective wells 22" in a double-row arrangement along the board strip. The printed circuit board 10" includes one or more printed circuitry layers 30" sandwiched between insulative layers 32", 34", and a ground plate or metal core 38". Electrical terminals 46" disposed on the printed circuit board 10" deliver electrical power the light emitting dice or chips 12" via the printed circuitry 30". A light transmissive cover 60" is tube-shaped to cover the long double-row of light emitting dice or chips 12" and has an open end defining a perimeter 62" that is received by a matching groove 66" formed in the printed circuit board 10". The tube-shaped cover 60" together secured to the printed circuit board 10" define an elongated or tubular interior volume 70" containing the light emitting dice or chips 12". A phosphor 72" optionally coats an inside surface of the tube-shaped cover 60". An encapsulant 76" substantially fills the interior volume 70" to encapsulate and pot the light emitting dice or chips 12" and the optional phosphor 72". In some embodiments, it is contemplated to replace the illustrated electric terminals 46" with conventional fluorescent tube end-terminals, and to include power-conditioning circuitry on the printed circuit board 10" so that the lighting package 8" is suitable for retrofit into a fluorescent lighting fixture.

Figure 9:
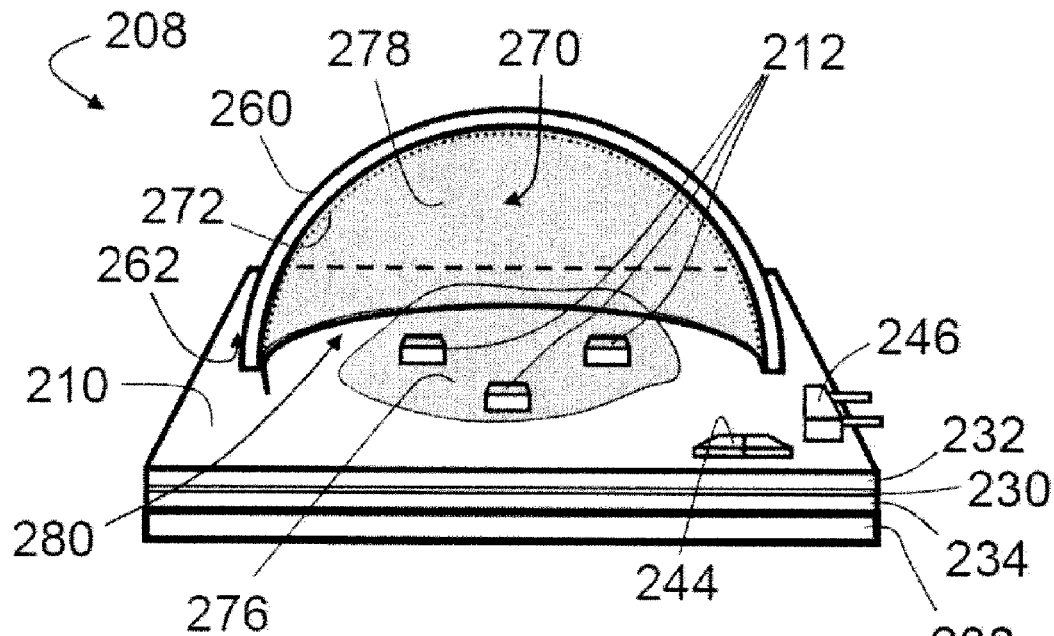
FIG. 9 shows a perspective view of another lighting component or package, in which the light emitting dice and the phosphor are encapsulated by separate encapsulants.

With reference to FIG. 9, yet another lighting package 208 includes a printed circuit board 210 on which one or more (specifically three in the illustrated embodiment) light emitting dice or chips 212 are arranged. In the lighting package 208, the light emitting dice or chips 212 are not disposed in reflective wells; rather, they are surface-mounted to a level surface of the printed circuit board 210. The printed circuit board 210 includes one or more printed circuitry layers 230 sandwiched between insulative layers 232, 234, and a ground plate or metal core 238. A zener diode component 244 provides electrostatic discharge protection for the light emitting dice or chips 212. Electrical terminals 246 disposed on the printed circuit board 210 deliver electrical power to the light emitting dice or chips 212 via the printed circuitry 230. A light transmissive cover 260 covers the light emitting dice or chips 212 and has an open end defining a perimeter 262 that is connected with the printed circuit board 210 to define an interior volume 270 containing the light emitting dice or chips 212. A phosphor 272 optionally coats an inside surface of the light transmissive cover 260. The above-described elements of the lighting component or package 208 are similar to corresponding elements of the lighting component or package 8 shown in FIGS. 1-3.

The lighting package 208 differs from the lighting package 8 in the configuration of the encapsulant disposed in the interior volume. In the lighting package 208, a first encapsulant 276 encapsulates and optionally pots the light emitting dice or chips 212, but does not substantially fill the interior volume 270. In some embodiments, the first encapsulant 276 may encapsulate only the one or more light emitting dice 212. A second encapsulant 278 encapsulates the phosphor 272 if such a phosphor is included in the package 208. In some embodiments, the second encapsulant 278 is the binding material of the phosphor 270. For example, the phosphor 272 may be applied to the inside surface of the cover 260, and the encapsulant in this embodiment is the binding material of the applied phosphor. Generally, the first and second encapsulants 276, 278 can be different materials. A substantial gap 280 extends between the first and second encapsulants 276, 278. Typically, the gap 280 contains air; however, it is also contemplated to fill the gap 280 with an inert gas to reduce moisture in the lighting package 208. In yet another embodiment, the gap 280 is filled with a third encapsulant different from at least one of the first and second encapsulants 276, 278. In the lighting package 208, there is no groove in the printed circuit board 210 for receiving the perimeter 262 of the cover 260. However, such a groove similar to the groove 66 of the lighting package 8 can optionally be provided to align and optionally help secure the cover 260 to the printed circuit board 210.

Figure 10:
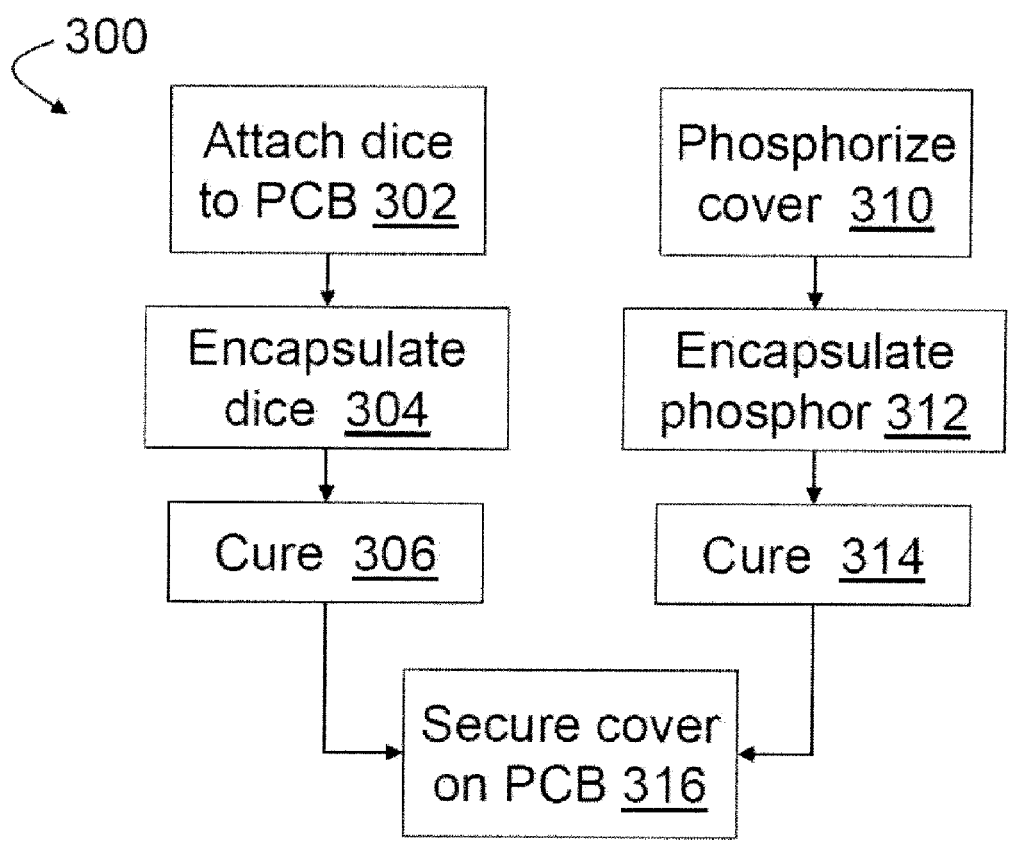
FIG. 10 diagrams an example process for manufacturing the lighting package of FIG. 9.

With continuing reference to FIG. 9 and with further reference to FIG. 10, an example process 300 for manufacturing the lighting package 208 is described. The light emitting dice or chips 212 are mechanically and electrically connected with the printed circuit board 210 in a die attach process 302. The die attach can involve flip chip bonding, soldering, wire bonding, or so forth. The attached light emitting dice 212 are encapsulated or potted on the printed circuit board 210 in a first encapsulation process 304, and the first encapsulant 276 is cured in a first curing process 306 applied to the printed circuit board 210.

Separately, the inside surface (and/or optionally the outside surface) of the light transmissive cover 260 is coated with the phosphor 272 in a phosphorizing process 310. In embodiments in which the cover has the phosphor embedded therein, the phosphorizing process 310 is omitted and instead the phosphor is incorporated during molding or other formation of the cover 260. The phosphor is encapsulated on the light transmissive cover 260 in a second encapsulation process 312, and the second encapsulant 278 is cured in a second curing process 314 applied to the light transmissive cover 314. If the phosphor 272 is omitted from the package 208, then process 310, 312, and 314 are suitably omitted. In some embodiments the second encapsulant 278 is the binding material of the phosphor 272; in these embodiments, the phosphorization process 310 and the second encapsulation process 312 are integrated. The light transmissive cover is then secured, optionally sealed, to the printed circuit board 210 in a securing process 316. The securing process 316 defines the interior volume 270, which is optionally a hermetically sealed volume.

Figure 11:
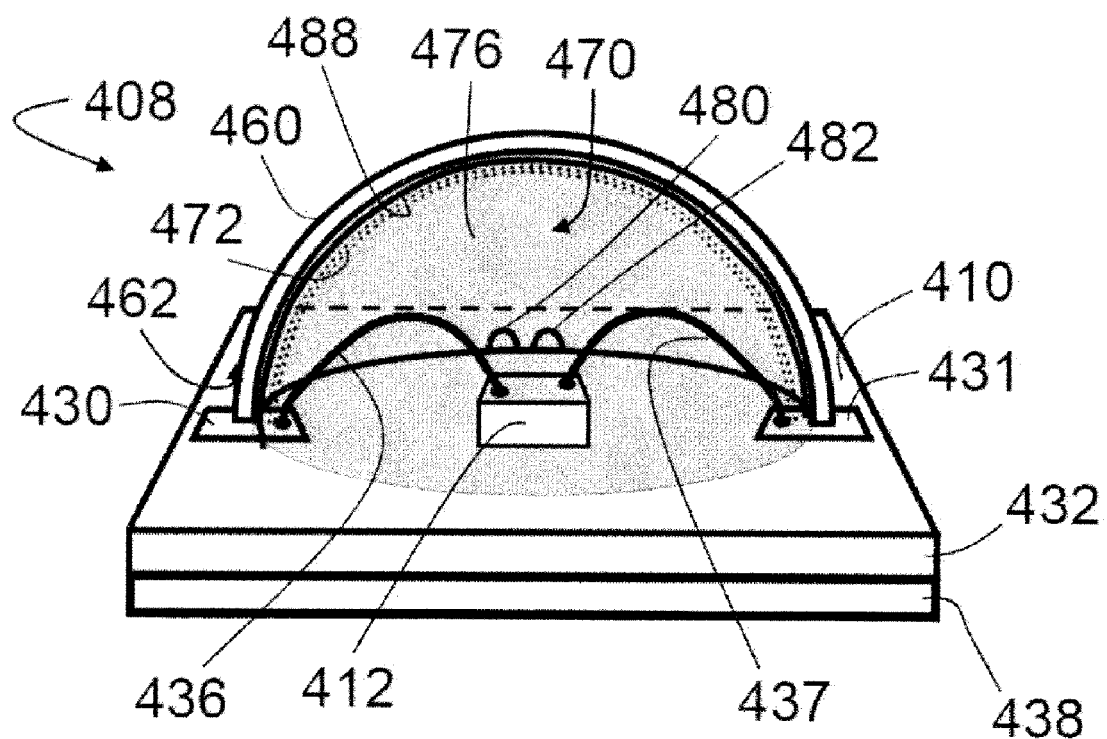
FIG. 11 shows a perspective view of another lighting component or package, in which the printed circuit board includes two evaporated conductive traces.

With reference to FIG. 11, still yet another lighting package 408 includes a printed circuit board 410 on which a single light emitting die or chip 412 is surface-mounted to a level surface of the printed circuit board 410. The printed circuit board 410 includes two printed circuit traces 430, 431 disposed on the same surface as the light emitting die 412. The two conductive traces 430, 431 can be formed by metal evaporation or the like. Wire bonds 436, 437 connect top-side electrodes of the light emitting die or chip 412 with the conductive traces 430, 431. The printed circuit board includes an insulative layer 432 on which the two printed circuit traces 430, 431 are formed, and an optional ground plate or metal core 438. A light transmissive cover 460 covers the light emitting die or chip 412 and has an open end defining a perimeter 462 that is connected with the printed circuit board 410 to define an interior volume 470 containing the light emitting die or chip 412. The two printed circuit traces 430, 431 extend from inside the cover 460 to outside the cover 460 to provide electrical communication into the interior volume 470. A phosphor 472 optionally coats an inside surface of the light transmissive cover 460, and an encapsulant 476 substantially fills the interior volume 470. Hemispherical openings 480, 482 formed at the perimeter 462 of the light transmissive cover 460 allow for injection of the encapsulant material and corresponding displacement of air. That is, the openings 480, 482 of the lighting package 408 serve the same purpose as the printed circuit hoard openings 80, 82 of the lighting package 8 (see FIG. 3).

With continuing reference to FIG. 11, a reflective coating 488 coats the inside surface of the light transmissive cover. The reflective coating 488 is substantially reflective for light produced by the light emitting die or chip 412 but is substantially transmissive for light produced by the phosphor 472 responsive to illumination by the light emitting die or chip 412. In the lighting package 408, the phosphor 472 is disposed on the reflective coating 488 and extends some distance into the encapsulant 476.

Figure 12:
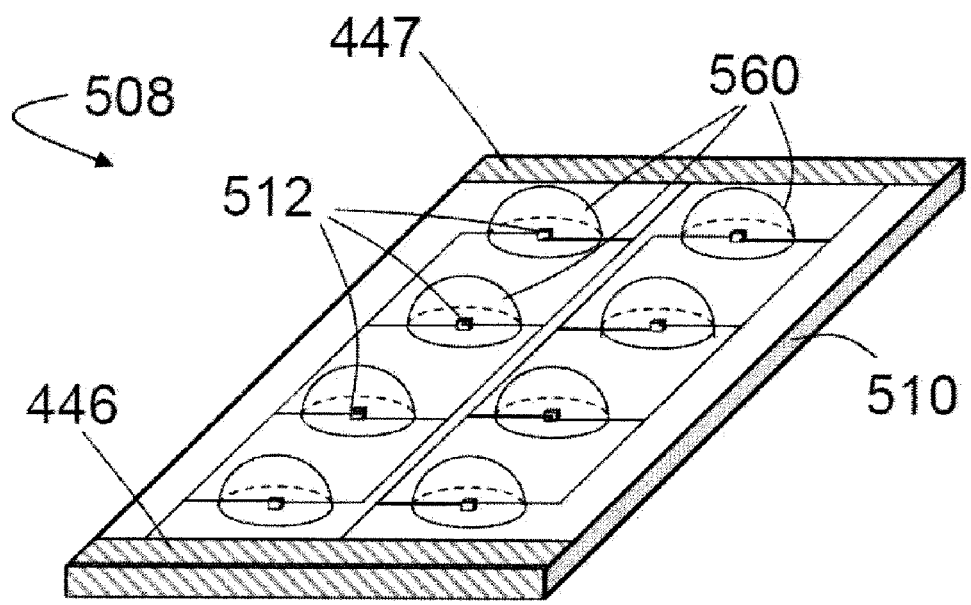
FIG. 12 shows a perspective view of another lighting component or package having light emitting chips arranged in a double-row, with a plurality of dome-shaped light-transmissive covers disposed over the light emitting chips.

With reference to FIG. 12, another example embodiment lighting package 508 is shown. A common printed circuit hoard 510 supports a plurality of light transmissive dome-shaped covers 560 each covering one or more light emitting dice 512. Printed circuitry of the common printed circuit board 510 connects the light emitting dice 512 with edge terminals 446, 447 that are adapted for connection with a DIN-type rail lighting fixture. In other contemplated embodiments, other types of terminals are employed. For example, the electric terminals 46 shown in FIG. 1 can be used.

In some contemplated embodiments, the printed circuit board 510 is a flexible printed circuit board, so that the light source of FIG. 12 is a flexible sheet lighting source. In such flexible embodiments the light emitting covers 560 provide mechanical protection for the light emitting dice 512. In some embodiments, the perimeter of each light transmissive dome-shaped cover 560 is secured to the flexible printed circuit board in a manner so as to impart tensile strain to the portion of the flexible circuit board covered by the dome-shaped cover 560. In this way, the portions of the flexible printed circuit board on which the light emitting dice 512 are disposed are kept substantially rigid by the tensile strain as the flexible printed circuit board is flexed, thus reducing a likelihood that the flexing will break the connections or bonds of the light emitting dice 512 with the printed circuit board. In some embodiments, the light transmissive dome-shaped covers 560 are arranged close together such that, together with light-dispersive properties of the covers 560, optional dispersive particles disposed in an encapsulant within the covers 560, light spreading provided by the distribution of phosphor across the covers 560, or so forth, a spatially uniform planar lighting source 508 is formed that produces little or no perceptible pixilation of the illumination at typical illumination source-to-target distances.

One advantage of the lighting packaging techniques disclosed herein is flexibility in deployment of phosphor compositions. One or more phosphor layers are readily disposed on the inner surface of the cover, for example as described previously with respect to phosphorization operations 104, 310 of FIGS. 4 and 10, respectively. Application of a layer of phosphor to a glass or plastic cover surface can be done in a precise and readily controllable manner. Each phosphor layer suitably includes a phosphor composition comprising one or more phosphor compounds.

Figure 13:
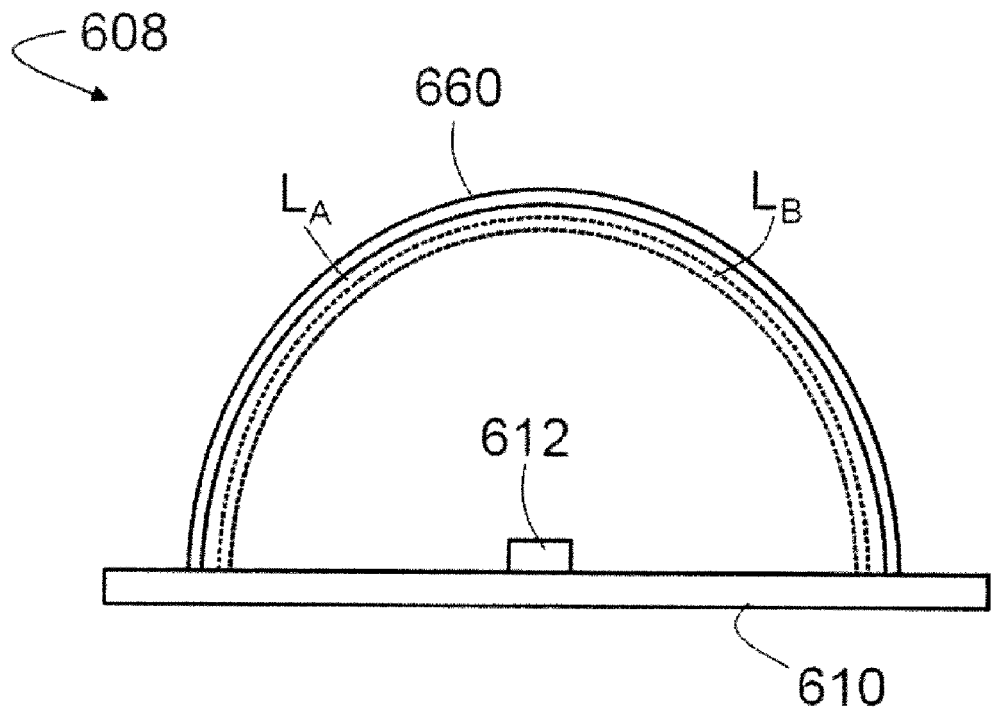
FIG. 13 shows a side sectional view of another lighting component or package having a light transmissive dome-shaped cover on which two different phosphor layers are disposed.
Figure 14:
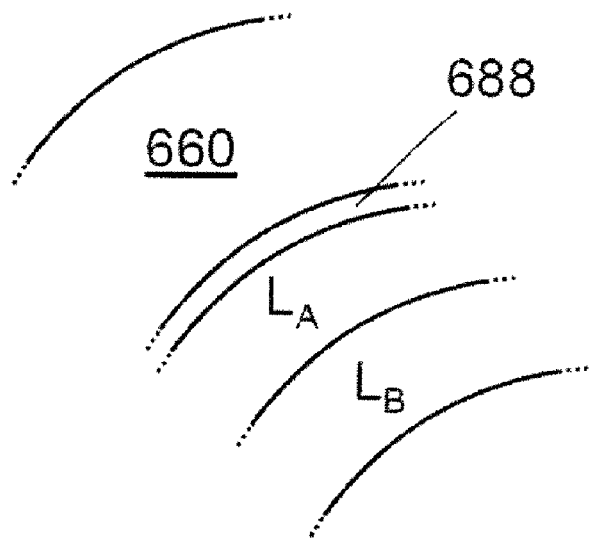
FIG. 14 is an enlarged sectional view of a portion of the light transmissive dome-shaped cover of FIG. 13, showing an optional ultraviolet reflective coating is disposed between the dome-shaped cover and the phosphor layers.

With reference to FIGS. 13 and 14, a lighting package 608 includes a printed circuit board 610 supporting a light emitting die or chip 612, or optionally more than one light emitting die or chip, covered by a light transmissive cover 660. Thus, the lighting package 608 is similar to the lighting package 8 of FIGS. 1-3. However, the lighting package 608 includes two phosphor layers $L_A$, $L_B$ of different phosphor compositions disposed on an inner surface of the light-transmissive dome-shaped cover 660. The phosphor composition of phosphor layer $L_B$ is different from the phosphor composition of layer $L_A$ in that they include at least one different phosphor compound. The lighting package 608 optionally includes other features set forth herein with respect to other embodiments, such as an optional ultraviolet reflective coating 688 diagrammatically shown in FIG. 14 disposed between the cover 660 and the phosphor layers $L_A$, $L_B$. The ultraviolet reflective coating 688 is useful for embodiments in which the light emitting die or chip 612 emits ultraviolet light while the phosphor layers $L_A$, $L_B$ generate visible light.

While two phosphor layers $L_A$, $L_B$ are illustrated, it will be appreciated that three or more phosphor layers can be provided so as to produce light output which is a blend three or more phosphors. The dome-shaped cover 660 provides a convenient platform for arranging one, two, or more phosphor layers each of which emits a spatially uniform distribution of light subtending about $2\pi$ steradians or more.

It is contemplated to employ the layered approach of FIGS. 13 and 14 in conjunction with the tunable CRI concept discussed previously. For example, the first phosphor layer $L_A$ may include a first constituent phosphor composition of blue, green, and yellow phosphor compounds A, B, and C, respectively, with a stoichiometry producing white or substantially white light at a first CRI value, while the second phosphor layer $L_B$ may include a second constituent phosphor composition of green, yellow, and red phosphor compounds B, C, and D, respectively, with a stoichiometry producing white or substantially white light at a second, different CRI value. The layered combination of the first constituent phosphor composition of layer L, and the second constituent phosphor composition of layer $L_B$ produces a CRI value that is different from, and possibly larger than, the first or second CRI value.

CRI tuning using a single layer containing two or more constituent phosphor compositions of about the same color point has been described with example reference to FIG. 3. CRI tuning using a layered structure in which each layer contains one of the constituent phosphor compositions of about the same color point has been described with example reference to FIGS. 13 and 14. The two or more constituent phosphor compositions whose light is blended to produce a tailored CRI and/or luminosity can be combined in other physical arrangements, such as being disposed as distinct patterns in a single layer.

With continuing reference to FIGS. 13 and 14, in some cases one of the phosphor compositions may become saturated at high levels of irradiation intensity by the light emitting die or chip 612. The layered arrangement of FIGS. 13 and 14 can also be useful in addressing such saturation issues. The more easily saturated phosphor composition is suitably arranged as the phosphor layer $L_A$ that is furthest from the light emitting die or chip 612, since partial absorption of light by the intervening phosphor composition of phosphor layer $L_B$ can be expected to reduce the excitation light flux of the phosphor composition in layer $L_A$, thus facilitating more efficient light conversion.

It is to be appreciated that the phosphors can be disposed in other spatially separated arrangements besides layers. For example, in some embodiments, the first phosphor composition may be arranged physically as a layer disposed on an inside or outside surface of the light-transmissive cover, while the second phosphor composition may be dispersed in an encapsulant filling the interior volume.

Figure 15:
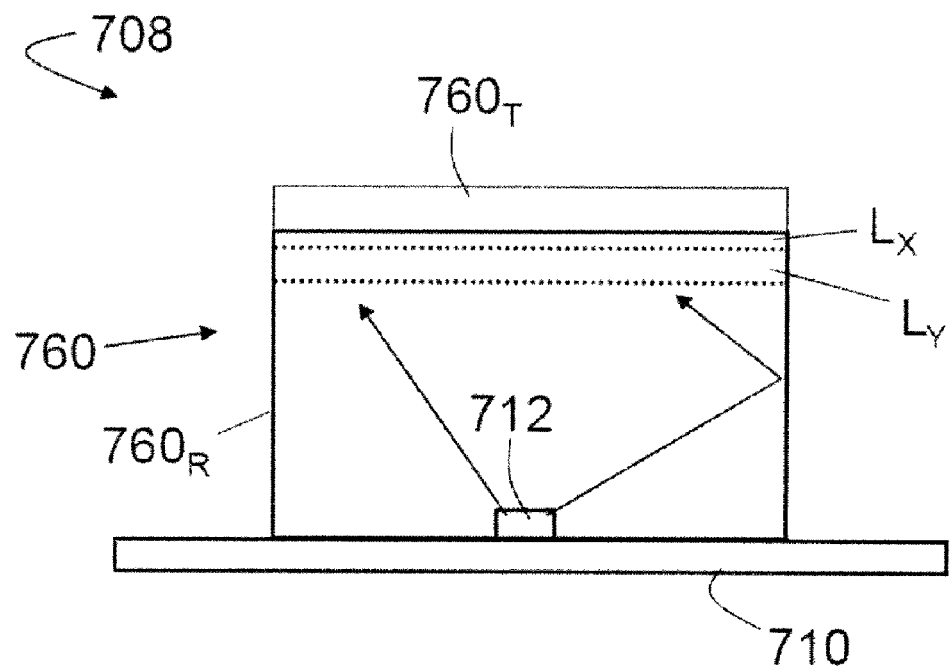
FIG. 15 shows a side sectional view of another lighting component or package having a light transmissive non-dome-shaped cover on which two different phosphor layers are disposed.

With reference to FIG. 15, a light-transmissive cover having other than a dome-shaped geometry can be employed. FIG. 15 shows a lighting package 708 that includes a printed circuit board 710 supporting a light emitting die or chip 712, or optionally more than one light emitting die or chip, covered by a light transmissive cover 760. Thus, the lighting package 708 is similar to the lighting package 608 of FIGS. 13 and 14, except that the light-transmissive cover 760 has a different geometry than the dome-shaped cover 660 of FIGS. 13 and 14. The light-transmissive cover 760 includes a reflective side portion or portions $760_R$ that channel light (indicated diagrammatically in FIG. 15 by two drawn rays) toward a light-transmissive top portion $760_T$. Two phosphor layers $L_X$, $L_Y$ of different phosphor compositions (that is, having at least one different phosphor compound) are disposed on the light-transmissive top portion $760_T$. Optionally, the two phosphor layers $L_X$, $L_Y$ may also extend along the inside of the reflective side portion $760_R$ of the light-transmissive cover 760. In some contemplated embodiments, the phosphor layers are disposed only on the inside reflective side portion $760_R$ of the light-transmissive cover 760, while the light-transmissive top portion $760_T$ is left uncoated by phosphor. In those of such embodiments that employ an ultraviolet-emitting die or chip 712, the light-transmissive top portion $760_T$ is preferably absorbing or reflective for ultraviolet light to prevent direct ultraviolet light from being emitted from the lighting package 708.

Figure 16:
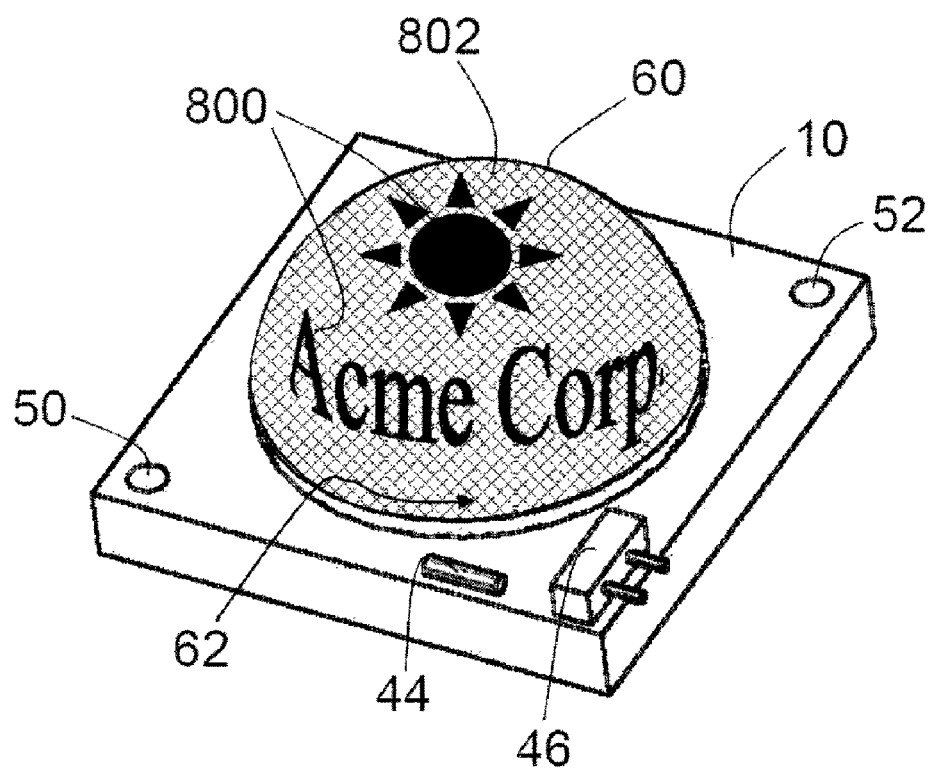
FIG. 16 shows a perspective view of another lighting component or package similar to that of FIGS. 1-3, but having the phosphor compositions screen-printed to display a corporate name and logo.

With reference to FIG. 16, depending upon how the phosphor layer or layers are disposed on the light-transmissive cover, a logo, picture, symbol, pattern, or other depiction can be generated. FIG. 16 shows a perspective view of another lighting component or package similar to that of FIGS. 1-3, but having two different phosphor compositions disposed on different regions 800, 802 screen-printed on the light-transmissive dome-shaped cover 60. The screen-printed phosphor region 800 spells out "Acme Corp." along with a corresponding logo, while the screen-printed phosphor region 802 covers the area of the light-transmissive dome-shaped cover 60 not covered by the phosphor regions 800. If for example, the phosphor composition of the region 800 emits red light while the phosphor composition of the region 802 emits white light, then when the one or more light emitting dice or chips within the cover 60 are energized, the name "Acme Corp." and corresponding logo appears in as a red light-emissive text and symbol on a white light emissive background. Advantageously, when using two different phosphor compounds in respective regions to define the logo, picture, symbol, pattern, or other depiction, both the foreground (e.g., text or logo artwork) and the background are light-emissive.

Some additional embodiments are disclosed as follows.

Figure 17:
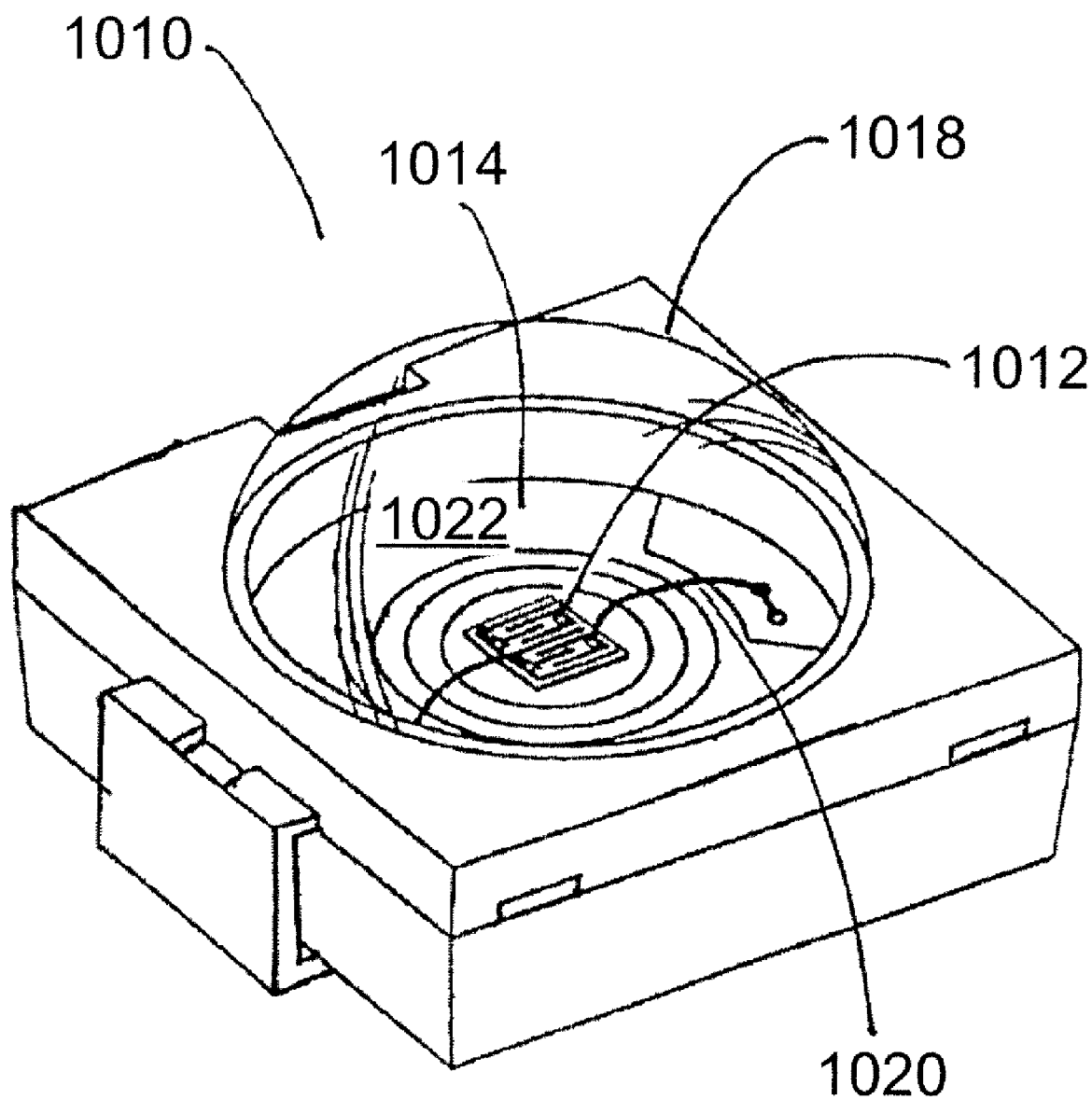
FIG. 17 is perspective view of a conventional LED package assembly.

Although the discussion below with respect to embodiments of the present invention is directed to LEDs for convenience, it should be understood that the invention relates to the use of any light emitting semiconductor. With reference to FIG. 17, a conventional LED assembly is shown generally at 1010.

The LED assembly includes an LED chip 1012 mounted on a bottom surface 1014 of the LED assembly. The LED chip 1012 emits radiation (typically UV or blue light in a white light LED). A lens 1018 made from a transparent material surrounds the chip 1012 and bottom surface 1014. Two lead wires 1020 connect the chip 1012 to a source of power. Filling the space 1022 between the lens and the chip 1012 is typically an epoxy or other transparent material (not shown). Intimately dispersed within the epoxy are phosphor particles (not shown) that absorb at least a portion of the emitted by the chip 1012 and converting it to a different wavelength.

Figure 18:
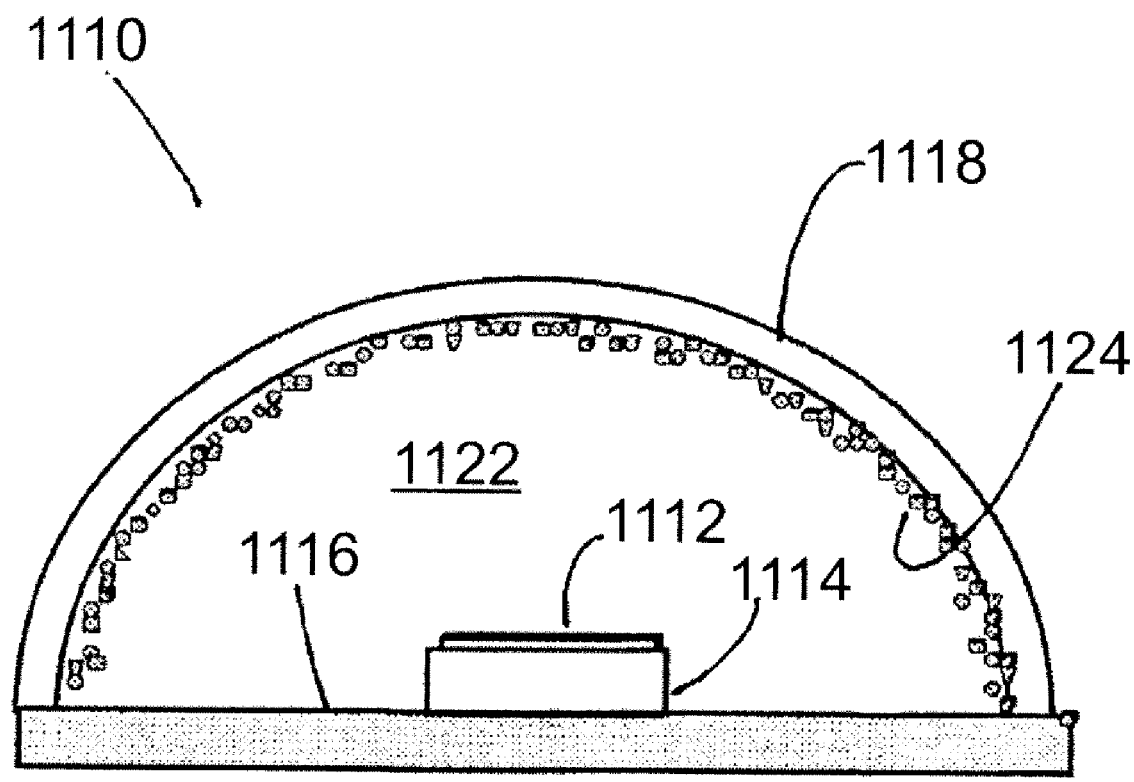
FIG. 18 is a cross-sectional view of an LED assembly.

With reference to FIG. 18, a cross-sectional view of an embodiment is shown. In this embodiment, an LED package is provided generally at 1110 and includes an LED chip 1112 mounted on a submount 1114, which in turn is mounted on a reflector 1116. As used herein, "reflector" is meant to include not only any surface on the bottom of the LED package, but also any other structures meant to support the LED chip, e.g. a heat sink, etc. A lens 1118 made from a transparent material surrounds the chip 1112 and submount 1114 and reflector 1116. Optionally filling space 1122 between the lens and the chip 1112 is typically an epoxy or other transparent material. A phosphor layer 1124 comprising phosphor particles is applied on an inside or outside surface of the lens 1118. The coating is preferably coated on an inside surface of the lens to prevent the phosphor coating from being displaced by handling, etc. The thickness of the phosphor coating should be sufficient to convert at least a portion of the radiation emitted by the LED chip to a different wavelength. This thickness may typically be between 6-200 µm, with a preferred thickness being between 20-30 micron µm.

The LED chip 1112 can be any conventional UV or blue light LED. Such LEDs are known and typically consist of InGaN or AlGaN layers epitaxially grown on a sapphire, alumina or single crystal SiC substrate. A preferred LED chip may have a primary emission in the range of 200-480 nm. Likewise, the phosphor layer 1124 may include one or more suitable fluorescent phosphors capable of absorbing the UV or blue radiation and in turn of producing, either alone or in combination with the radiation emitted by the LED chip, a visible white or near-white light for illumination. Suitable phosphors for use in the present invention include, but are not limited to, $Y_3Al_5O_2$:Ce (YAG:Ce), $Tb_3Al_{4.9}O_{12}$:Ce (TAG:Ce), and $Sr_4Al_{14}O_{25}$:Eu (SAE). Other white light producing phosphors are also suitable. The size of the phosphor particles is not critical, and may be, by way of example, about 3-30 µm in diameter.

The lens 1118 may be made from any material that is substantially transparent to the radiation emitted by the phosphor and the LED chip. Thus, depending on the wavelength of the emitted radiation, the lens may comprise various materials including, but not limited to, glass, epoxy, plastic, thermoset or thermoplastic resins, or any other type of LED encapsulating material known in the art.

The providing of the phosphor coating 1124 on an inside surface of the lens 1118 rather than dispersed in the epoxy or other fill material provides a more uniform and efficient conversion of the LED emission. One advantage is that a uniform coating of controlled thickness may be applied. One benefit of this is that coating thickness can be accurately controlled for optimum conversion efficiency and UV bleed through (if a UV emitting chip is used) control using a minimum amount of phosphor. This helps to achieve uniform light emission without incidence of color rings resulting from non-uniform dispersion of the phosphor in prior art devices. Another benefit is that the phosphor is remote from the heat generated by the LED, further increasing the conversion efficiency. Of course, the phosphor layer may be positioned inside the lens material or have a coating of another material positioned over it, and such an arrangement is contemplated herein.

Although not intended to be limiting, the phosphor coating may be applied by, for example, spray coating, roller coating, meniscus or dip coating, stamping, screening, dispensing, rolling, brushing or spraying or any other method that can provide a coating of even thickness. A preferred method for applying the phosphor is by spray coating.

In an exemplary technique for coating the lens and reflector parts of the LED housing, the phosphor powder is first stirred into a slurry, along with a binder and a solvent. Suitable binders include, but are not limited to, silicone, epoxies, thermoplastics, acrylics, polyimides, and mixtures thereof. Suitable solvents include, but are not limited to, low boiling point solvents such as toluene, methyl ethyl ketone (MEK), methylene chloride, and acetone. The amount of each component in the slurry is not critical, but should be chosen so as to produce a slurry that is easily applied to the lens while also containing a sufficient concentration of phosphor particles for efficient conversion of the LED radiation. An exemplary slurry can be made using about 2 parts by weight of a 6 µm phosphor, 1.2 parts silicone, and 1 part MEK. A suitable silicone is GE XE5844.

The slurry is subsequently applied to the surface of the lens. The coated lens may then be baked, heated or otherwise treated to remove the solvent and cure the binder. As used herein, the term "cure" is meant to encompass not only actual curing or crosslinking of the binder, but also more generally to indicate any chemical and/or physical change in the binder to a state in which the phosphor particles become relatively stationary in the hinder, typically due to a solidifying or hardening of the binder.

As noted above, the slurry can be applied to the lens via any suitable method. In a preferred method, the slurry is applied by spray coating. In this method, the slurry is used to fill the reservoir of a suitable air brush. The slurry is then sprayed using a pressurized spray gun onto the lens, which is preheated and kept on a hot plate at an elevated temperature preferably above the boiling temperature of the solvent, for example at about 110° C. The part is sprayed by making successive passes, which may be done at about ½ second per pass. The slurry dries on contact and a uniform coating is achieved. A coating approximately 4 layers thick (about 20-30 µm using 6 µm size phosphor particles) is achieved on the lens with 35-40 passes. The lens is then baked to cure the binder. It is planned that this approach to coating LED's would be used for any LED's for general illumination. If desired, a second coating of a transparent material may be added over the phosphor layer to protect the phosphor or to provide an overcoating to help light extraction.

A significant improvement in light output has been achieved using blue LED's with the YAG phosphor over the conventional coating method wherein the phosphor is embedded in the slurry and uniformly applied around the chip. Clearly there are many other ways to remotely the lens surrounding an LED chip. These would be considered within the scope of this invention.

In one preferred embodiment, the lens preferably has a radius that is at least about 2-3 times the length ("L") of one side of the chip. This arrangement increases the likelihood that radiation generated or reflected off a coating applied to such a lens is more likely to strike other parts of the coating, where it will be retransmitted, rather than the chip or other non-coated area, where it will be absorbed and lost.

In a second embodiment, illustrated in FIG. 19, an LED package is again provided at 1210 and includes an LED chip 1212 mounted on a submount 1214, which in turn is mounted on a reflector 1216. A lens 1218 surrounds the chip 1212 and submount 1214 and reflector 1216. Optionally filling space 1222 between the lens and the chip 1212 is typically an epoxy or other transparent material. To further improve efficiency, a phosphor coating 1224 comprising phosphor particles is applied on an inside surface of the lens 1218 and on the top surface of the reflector 1216. The top surface of the reflector, which may be thought of as the bottom of the package, is preferably first coated with a reflective layer 1240, such as a high dielectric powder, such as, alumina, titanic, etc. A preferred reflective material is $Al_2O_3$. The phosphor layer 1224 is then placed over the reflective layer 1240 on top of the reflector. The use of the reflective layer 1240 serves to reflect any radiation 1242 that penetrates the phosphor layer 1224 on this surface. Alternately, instead of coating the transparent lens 1218 with a separate phosphor layer 1224, the phosphor may instead be intimately dispersed within the material comprising the transparent hemisphere.

The phosphor layer 1224 over the reflective layer 1240 on the reflector 1216 is preferably relatively thick, i.e. greater than 5 layers of powder, while the phosphor layer on the curved top of the hemisphere may be adjusted to achieve a desired color and to absorb all radiation incident on it. In general the phosphor layer on the top of the hemisphere will range between 1-4 layers thick in the case of blue emitting chips in order that some of the blue radiation be emitted. In the case of UV chips the layer of phosphor coating on the hemisphere should be 4-8 layers thick in order to absorb at least most of the UV radiation emitted by the chip.

Figure 19:
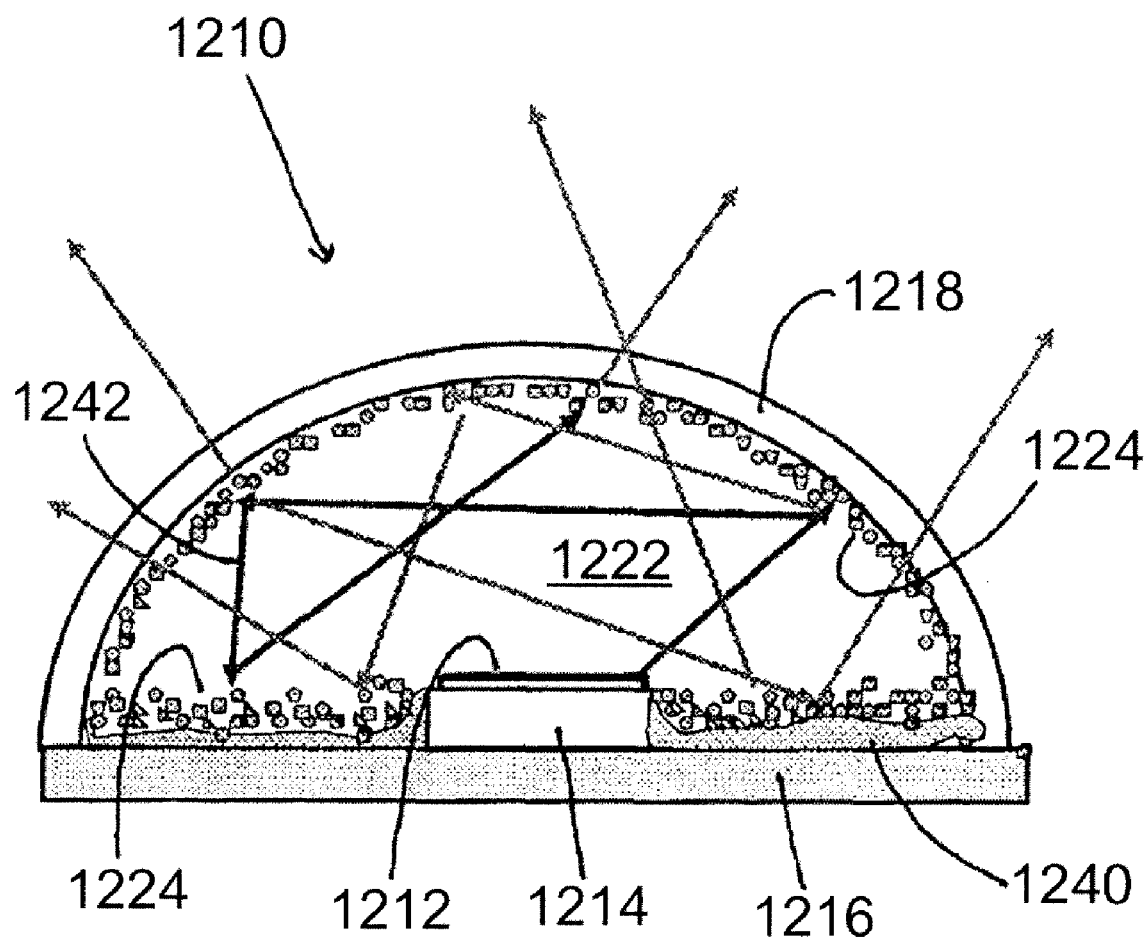
FIG. 19 is a cross-sectional view of an LED assembly.

As shown in FIG. 19, radiation from the chip 1242 is prevented from leaving the structure without first striking the phosphor coated surface of the hemisphere. Further, the total phosphor coated surface area is much greater than the surface area of the emitting chip, preferably at least 10 times the exposed surface area of the absorbing parts of the LED chip. As used herein, the exposed surface area of the absorbing parts of the LED include the exposed surface are of the LED chip as well as any exposed surface of the submount not covered with a reflective layer and/or a phosphor layer.

In such an arrangement, although there may be a significant amount of blue or UV radiation scattered back into the hemisphere, nearly all this radiation, which is diffusely scattered, strikes other parts of the phosphor coating rather than the chip or submount. Most of the visible light generated by the phosphor coating also is directed back into the hemisphere. Also there is no metallic reflector and no exposed lead structure. The important feature of this geometry is that everything except the LED chip 1212 is phosphor covered and the phosphor surface area of the hemisphere is much larger, preferably greater than 10 times, the surface area of any absorbing parts of the LED. Therefore, nearly all radiation going back into the hemisphere will strike other phosphor-coated areas and be either reflected or absorbed and retransmitted by the phosphor. The embodiments disclosed herein are calculated to have an efficiency greater than 70%, and in most cases approaching 100%.

In Table 1 the efficiency of this design is compared with several standard LED package geometries. These comparisons were made using a computer simulation. The computer simulation is a flux model described below. It considers all the radiation fluxes and assumes that all are diffuse so that the amount of radiation incident on any given surface is proportional to its area. As shown in Table 1 the geometry described above provides a package efficiency of essentially 100%.

TABLE 1

Comparison of Calculated Package Efficiencies of Two Standard Configurations of Phosphor Coated LED's with 3 Embodiments Disclosed in the Present Invention

| LED Description | Package Efficiency | | Milliwatts/ lumen | |
|---|---|---|---|---|
| | SiC substrate | $Al_2O_3$ substrate | SiC substrate | $Al_2O_3$ substrate |
| 1.6 mm² chip + 27 mm² reflector + phosphor on chip | 58% | 70% | 6.7 | 5.6 |
| 1.6 mm² chip + phosphor on chip | 69% | 80% | 5.7 | 4.9 |
| 1.6 mm² chip + 27 mm² reflector + phosphor on lens (FIG. 5) | 82% | 88% | 4.7 | 4.4 |
| 1.6 mm² chip + 3 mm radius hemisphere (FIG. 3) | 98% | 99% | 4 | 3.9 |
| 1.6 mm² chip + 3 mm radius sphere (FIG. 4) | 99% | 100% | 3.9 | 3.9 |

Figure 20:
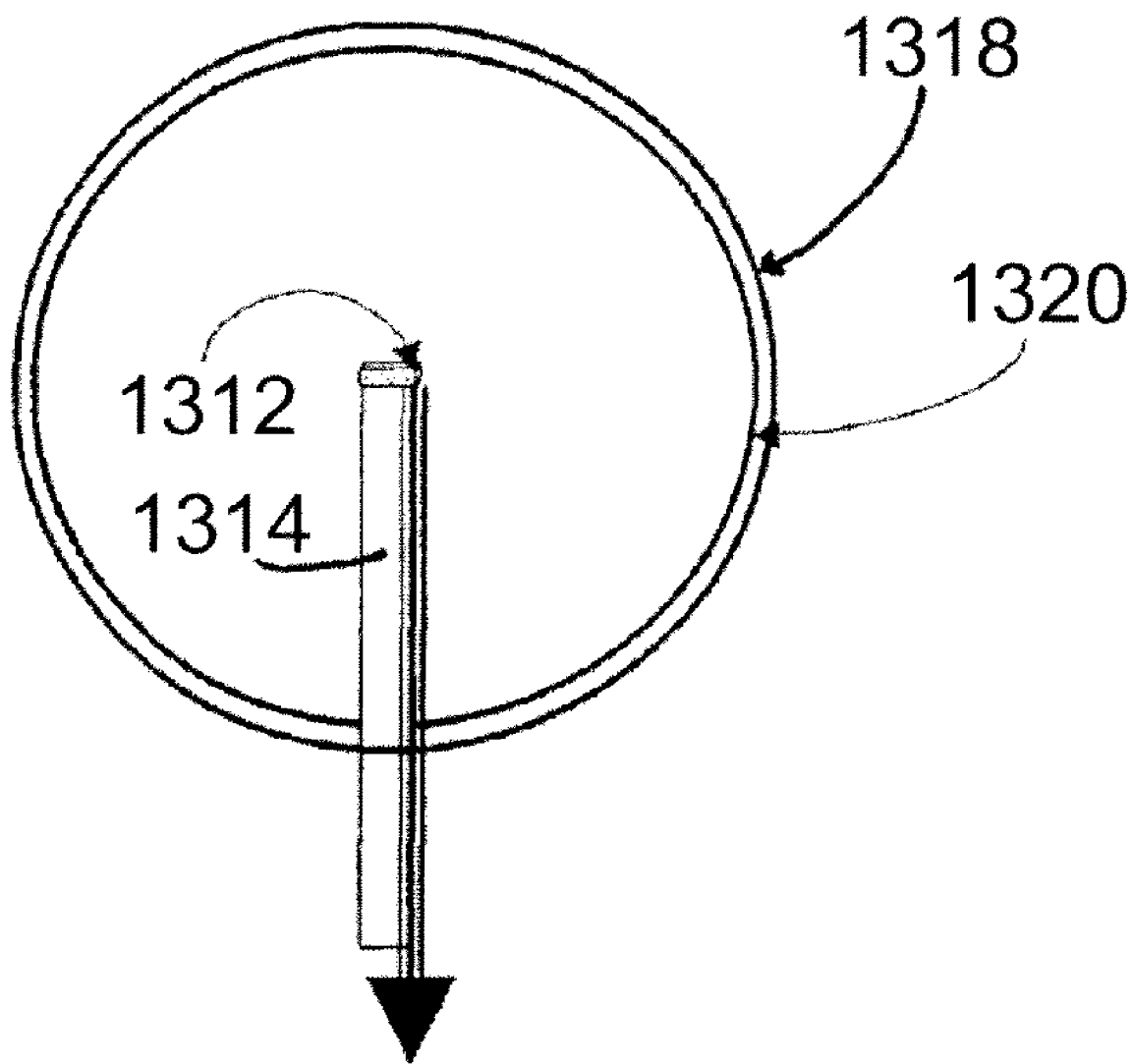
FIG. 20 is a cross-sectional view of an LED assembly.

FIG. 20 shows an embodiment operating under the same principle. Here an LED chip 1312 is mounted on a pedestal 1314 which also serves as the heat sink. However, the chip 1312 is placed at the center of a molded sphere 1318. A phosphor layer (not shown) is then coated on the inside surface 1320 of the sphere 1318 or, alternately, intimately dispersed within the sphere. In this design the LED will radiate uniformly in all directions. Again, it is clear that both blue/UV radiation and visible radiation generated by the phosphor coating and scattered back into the sphere will be more likely to strike other phosphor coated surfaces in preference to striking either the chip 1312 or the pedestal 1314. These light absorbing structures are small targets for the diffuse radiation. As seen in Table 1, the package efficiency is close to 100% for this arrangement. The lower package efficiency for LED structure on SiC substrates are due to greater absorption of the LED radiation by the SiC substrate as compared to the $Al_2O_3$ substrate.

From the previous embodiments, It is apparent that the specific shape of the phosphor coating is not important as long as it surrounds as completely as possible the LED chip and is a distance sufficient from this chip (e.g. a distance such that the phosphor coated surface has a surface area greater than about 10 times the exposed surface area of the chip) such that radiation scattered from the coating is unlikely to strike the chip or chip structures. The invention is not limited to the embodiments described herein but intended to embrace all such coating shapes, and preferably wherein the phosphor covered surfaces has approximately 10 times the exposed area of the absorbing parts of the LED or greater. Thus, the lens on which the phosphor is coated is not limited to hemispherical or spherical, but can include any geometric shape, preferably with the phosphor coated surface area being about at least 10 times the exposed area of the absorbing parts of the LED.

Figure 21:
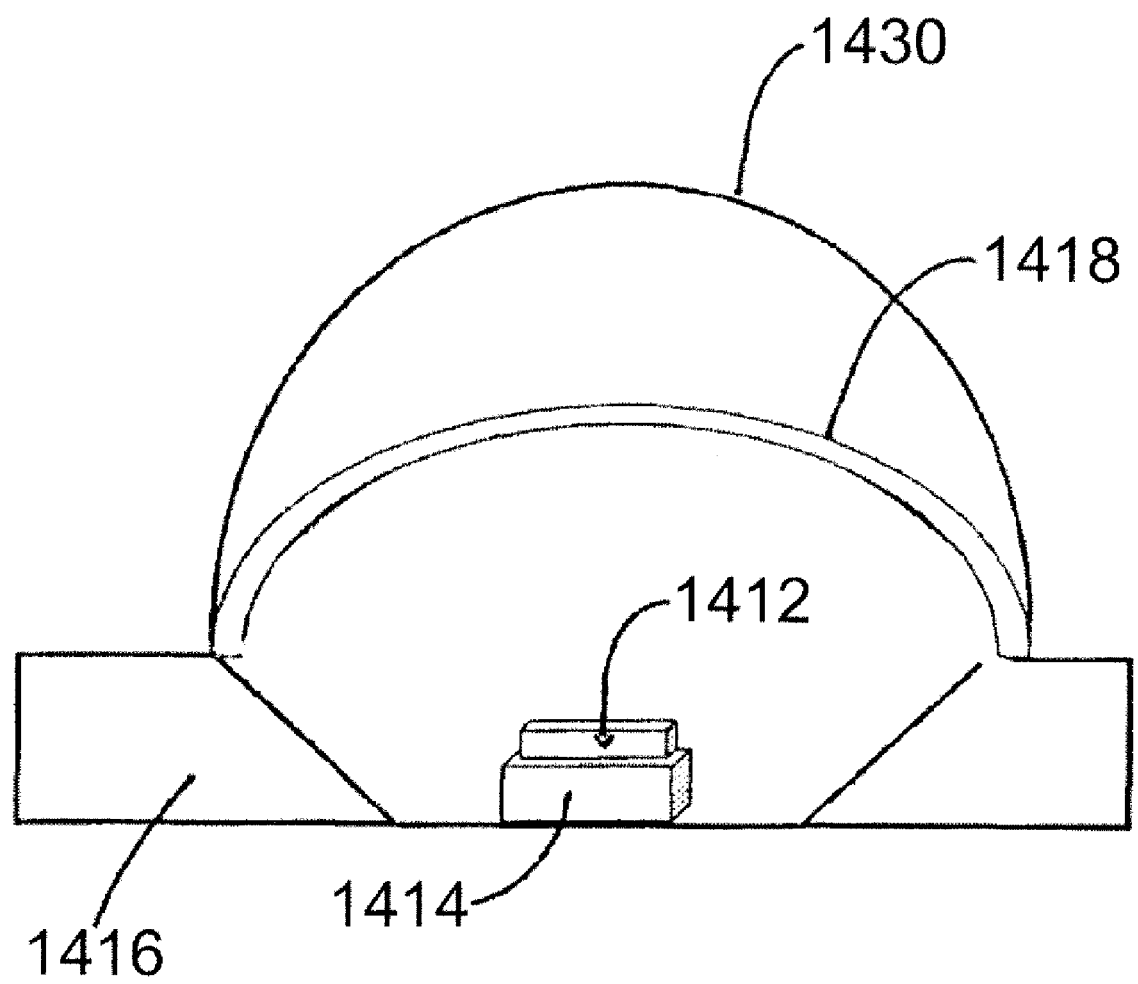
FIG. 21 is a cross-sectional vie of an LED assembly.

The invention is also intended to cover geometries which are not so ideal and perhaps do not give the full advantage of 100% package efficiency but nevertheless do utilize the principle of a remote phosphor coating designed so that the coated surface is at least 10 times the emitting area of the chip. For example FIG. 21 shows a schematic of a conventional surface mount LED. In this arrangement, the LED chip 1412 and submount 1414 are mounted in a reflector cup 1416. Unlike the conventional design, which has the phosphor embedded more or less randomly in an optical medium between reflector and the lens, the phosphor coating is applied as a layer on a transparent lens 1418. The phosphor coating is remote from the chip 1412 and on a surface with about >10 times the exposed area of the absorbing parts of the LED. Obviously, the surface of the lens 1418 on which the phosphor coating is applied can have a surface area less than 10 times the surface area of the chip. However, the package efficiency of the assembly will be reduced accordingly, since more of the radiation will strike and be absorbed by the chip. A second lens 1430 can be mounted over the phosphor coated lens for protection.

Most of the UV or blue radiation and visible radiation which is scattered back from the phosphor coating strikes either the reflector cup 1416 or other phosphor surface. Only a relatively small amount strikes the light absorbing chip and submount. In this design it is important that the reflector cup 1416 be made of a very highly reflective material, for example a vapor deposited and protected silver coating with greater than 95% reflectivity or an inorganic powder of high purity, such as finely divided alumina or titania. In addition the reflector cup 1416 may or may not be coated with the phosphor. Table 1 shows the simulated performance of a specific LED with an area of 1.6 mm² on a submount in a silver reflector cup utilizing a phosphor coated lens of area of 27 mm².

Figure 22:
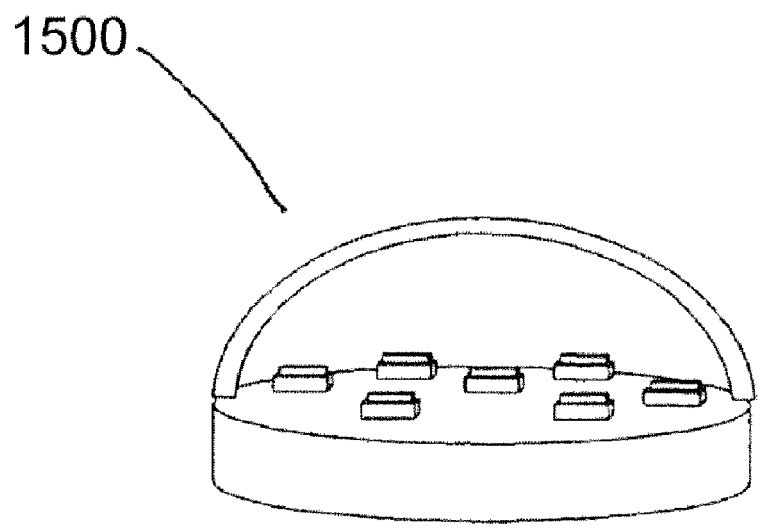
FIG. 22 is a side perspective view of an LED assembly.
Figure 23:
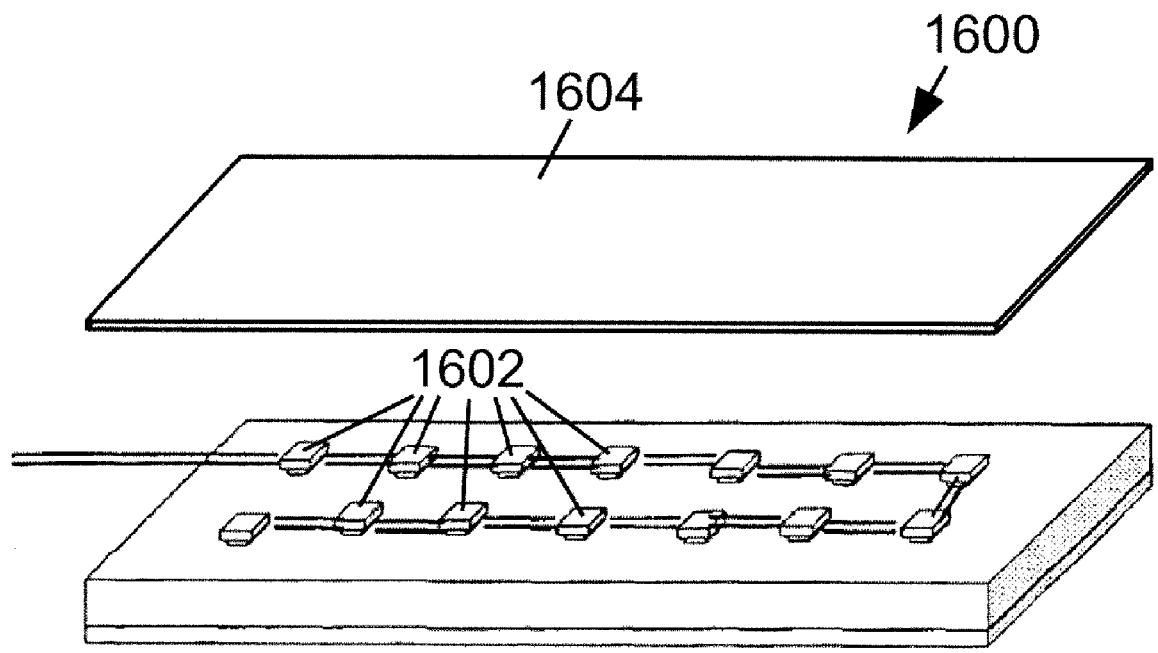
FIG. 23 is a side perspective view of an LED assembly.

As shown in FIGS. 22 and 23, the present invention also discloses the concept of a remote phosphor coating as applied to systems containing multiple LED chips. Multiple blue or UV emitting LED's can be mounted on a single reflective electrical interconnect board or other structure. A phosphor coated surface then is used to surround not a single LED but the entire set of LED's. The phosphor coated surface may be used alone or in combination with other highly reflecting surfaces to surround the set of LED's. Two examples of such structures are shown in FIGS. 22 and 23. One is a power module 1500 which might be used as a downlight. The other is a panel lamp 1600 with many LED's 1602 mounted behind a phosphor coated panel 1604. It is clear that many such arrangements could be made provided that the phosphor surface area is the preferred 10 times the exposed area of the absorbing parts of the LED.

As detailed above, any of the embodiments may include an epoxy or other transparent filler between the LED chip and the phosphor coated lens. More efficient extraction of light can be realized when the refractive index of the encapsulant or transparent filler is closely matching the geometric mean of the refractive indexes of the die and the lens, preferably within about 20% of this value, and even more preferably within about 10%. This reduces the amount of internal reflections in the lamp. Thus, in the case of a GaN LED chip having a refractive index of about 2.7 with a lens having a refractive index of about 1.5, the filler will preferably have a refractive index of from about 2.1. In the case of an LED chip having two or more materials having different refractive indices, such as a GaN semiconductor on a sapphire submount having a refractive index of about 1.7, the refractive index of the encapsulant will preferably match the geometric mean of the lens and the higher of the two. Better light extraction can thus be achieved with encapsulants having a higher index of refraction than epoxy, such as spin-on glass (SOG) or other high refractive index materials.

Any of the above embodiments can also be equipped with one or more baud pass filters to further improve the efficiency of the resulting LED package. Thus, in one embodiment, as shown in FIG. 25, a lens 1718 for a blue LED source is shown containing a first band pass filter 1750. The band pass filter is positioned between the phosphor layer 1724 and the LED (not shown). The band pass filter is selected such that the incident light 1752 from the blue LED source is allowed to pass while the light 1754 emitted from the phosphor layer 1724 is reflected outward.

In the embodiment shown in FIG. 26, two band pass filters are provided in a UV LED source package. In this embodiment, a first hand pass filter 1850 is positioned between the phosphor layer 1824 and the LED source (not shown) adjacent a lens 1818. The first band pass filter acts to transmit the UV light 1852 from the LED while reflecting the light 1854 emitted from the phosphor layer 1824. A second band pass filter 1856 reflects the UV light 1852 from the LED while allowing the light 1854 emitted from the phosphor layer 1824 to pass. This arrangement prevents the transmission of potentially harmful UV radiation from the package while ensuring transmission of visible light.

Figure 27:
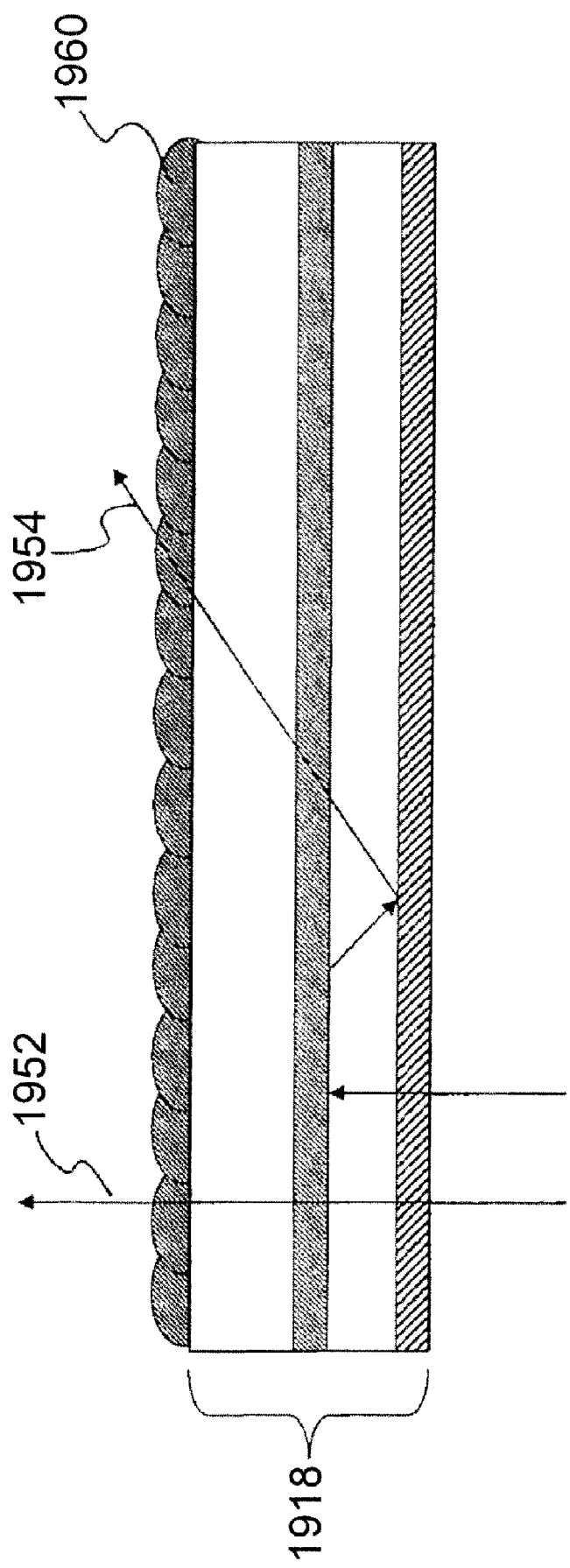
FIG. 27 is a cross-sectional view of a lens containing an array of micro or macro lenses is formed on the outer surface of the lens to control the emission angle, direction or intensity of the emitted radiation.

As seen in FIG. 27, an array of micro or macro lenses 1960 may be formed on the outer surface of the lens 1918 in any of the above embodiments to control the emission angle, direction or intensity of the emitted radiation 1952 and 1954.

Figure 24:
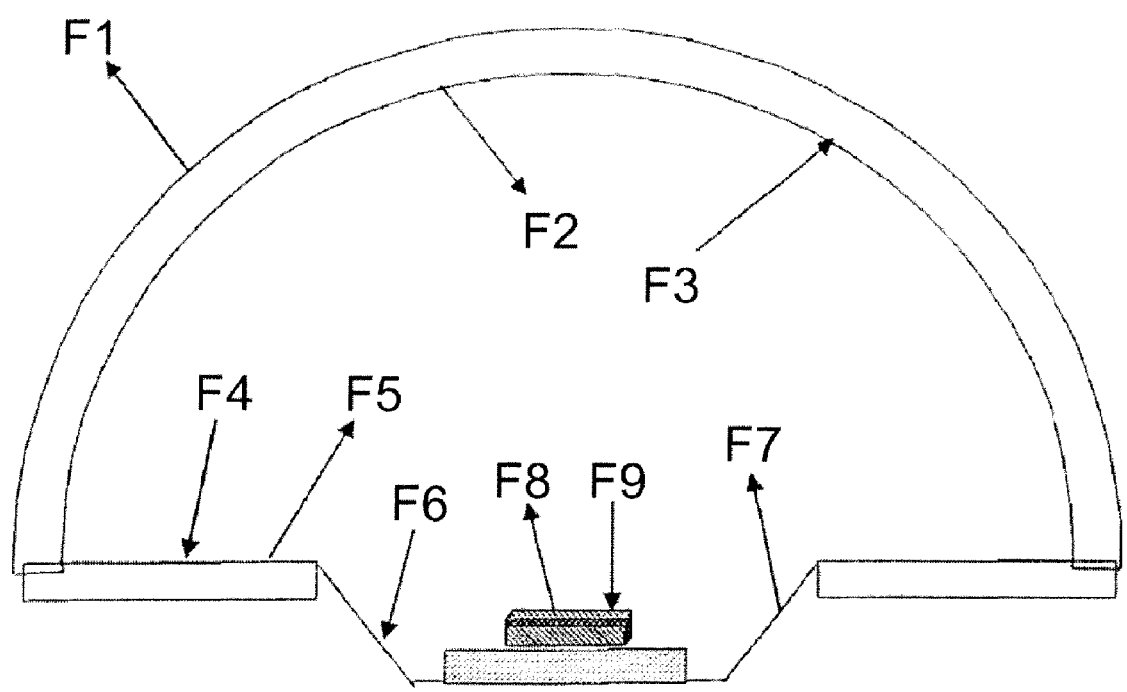
FIG. 24 is a representation of an LED assembly according to an embodiment depicting flux lines for radiation incident on its various surfaces.

The calculation results shown in Table 1 are based on a linear flux model illustrated in the FIG. 24. The figure shows nine fluxes incident on four surfaces of the LED package. These fluxes are described by the nine linear equations below, with each equation describing the flux with the corresponding number. The equations are:

Flux F1: $L_3^{out} = L_3^+ t_3^{VIS}$

Flux F2: $L_3^- = L_3^+ r_3^{VIS} + I_3^+ a_3^{UV} Q(\bar{\lambda}_I/\bar{\lambda}_L)\left(\frac{1}{2}\right)$ Flux F3: $L_3^+ = L_2^- p_{23} + L_1^- p_{13} + L_0^- p_{03} + I_3^+ a_3^{UV} Q(\bar{\lambda}_I/\bar{\lambda}_L)\frac{1}{2}$ Flux F4: $L_2^+ = L_3^- p_{32} + L_1^- p_{12} + L_0^- p_{02} + I_2^+ a_2^{UV} Q(\bar{\lambda}_I/\bar{\lambda}_L)\frac{1}{2}$ Flux F5: $L_2^- = L_2^+ r_2^{VIS}$ Flux F6: $L_1^+ = L_3^- p_{31} + L_2^- p_{21} + L_0^- p_{01}$ Flux F7: $L_1^- = L_1^+ r_1^{VIS}$ Flux F8: $L_0^+ = L_3^- p_{30} + L_2^- p_{20} + L_1^- p_{10}$ Flux F9: $L_0^- = L_0^+ r_0^{VIS}$ These surfaces are:
3=the upper phosphor coated surface,
2=the lower phosphor coated surface,
1=the reflector and submount, and
0=the blue or UV emitting chip.

There are nine other equations describing the blue or UV fluxes. The equations describing the blue or UV fluxes are not shown. They are coupled to the visible light equations through the quantum efficiency Q and the Stoke's s shift ($\lambda i/\lambda I$). The eighteen linear equations result in eighteen unknowns, i.e. the relative powers of radiation striking each surface, and are solved simultaneously.

The p values are the probabilities that radiation from one surface will strike another. In the calculations shown in Table 1 these were taken to be the ratios of surface areas. Q is the quantum efficiency of the phosphor. $\lambda$ is the average wavelength of the blue or UV chip radiation or the average wavelength of the visible emission of the phosphor.

The other parameters needed are the reflectivities and absorptivities of the different material surfaces. These were obtained either from Handbook values or were measured directly using known methods. There are no values for the reflectivities of the chips and so these were calculated by assuming that each chip consisted of the semiconductor layers and substrate. All radiation incident on the chip was assumed to be normal and incident on the substrate in a flip-chip design and diffraction effects were ignored. Up to second order the expression for the reflectivity of the chip is then:

$R = R_{sub} + (1-R_{sub})^2 \exp(-2a_{sub}t_{sub})R_{act} + (1-R_{Sub})^2 \exp(-2a_{sub}t_{sub})(1-R_{act})^2 \exp(-2a_{act}t_{act})R_{mst}\ldots$ where:
$R_{sub}$=reflectivity of substrate $R_{act}$=reflectivity of active layers
$a_{sub}$=absorption cost of sub $a_{act}$=absorption coefficient of active layers
$t_{sub}$=thickness of substrate $t_{act}$=thickness of active layers
Known or estimated values were used for the indices of refraction, the absorption coefficients and thicknesses. Thus, $R = ((n1-n2)^2 + k^2)/((n1+n2)^2 + k^2)$, where $k = \lambda a/2\pi$.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A lighting apparatus comprising:
a support surface;
a light source comprising at least one light emitting diode (LED) chip, the light source being disposed on the support surface;
a light transmissive body including a phosphor, said body being disposed over and spaced apart from the light source, the phosphor configured to perform wavelength conversion of light emitted by the light source; and
reflecting surfaces extending between the support surface and the light transmissive body;
wherein the support surface, the light transmissive body, and the reflecting surfaces are arranged and dimensioned respective to the light source such that most light scattered back from the phosphor strikes either the reflecting surfaces or the light transmissive body.

2. The lighting apparatus as set forth in claim 1, wherein the light transmissive body is arcuate having a perimeter larger than a perimeter of the support surface, and the reflecting surfaces extend between the smaller perimeter of the support surface and the larger perimeter of the arcuate light transmissive body.

3. The lighting apparatus as set forth in claim 1, wherein the reflecting surfaces comprise at least substantially transverse reflecting surfaces that are at least substantially transverse to the support surface.

4. The lighting apparatus as set forth in claim 3, wherein the transverse reflecting surfaces extend at a nonperpendicular angle between a smaller perimeter of the support surface and a larger perimeter of the light transmissive body.

5. The lighting apparatus as set forth in claim 1, wherein the reflecting surfaces include a reflector cup containing the light source.

6. The lighting apparatus as set forth in claim 5, wherein the reflecting surfaces further include one or more reflecting surfaces other than the reflecting cup that extend between the reflector cup and the light transmissive body.

7. The lighting apparatus as set forth in claim 1, wherein the support surface is planar and the light transmissive body is spaced apart from the plane of the support surface, and the reflecting surfaces include reflective sidewalls extending from the planar support surface to the light transmissive body.

8. The lighting apparatus as set forth in claim 7, wherein the reflective sidewalls include slanted reflective sidewalls.

9. The lighting apparatus as set forth in claim 7, wherein the light transmissive body comprises a planar phosphor inclusive surface spaced apart from planar support surface.

10. The lighting apparatus as set forth in claim 1, wherein the light source comprises an elongated light source comprising a plurality of LED chips distributed on and over a length of an elongated support surface, and the light transmissive body has elongation commensurate with the elongation of the elongated support surface.

11. The lighting apparatus as set forth in claim 10, wherein the reflecting surfaces include reflective sidewalls extending from the elongated support surface to the elongated light transmissive body.

12. The lighting apparatus as set forth in claim 1, wherein the lighting apparatus is oriented as a downlight.

13. The lighting apparatus as set forth in claim 1, wherein the support surface comprises a reflective support surface.

14. A lighting apparatus comprising:
at least one light emitting diode (LED) chip; and
a light mixing chamber including reflecting surfaces defining a light output aperture of the light mixing chamber and a light transmissive body including a phosphor, said light transmissive body being disposed over the light output aperture of the light mixing chamber, the phosphor configured to perform wavelength conversion of light emitted by the at least one LED chip;
wherein the at least one LED chip is disposed in the light mixing chamber and is spaced apart from the light transmissive body such that most light scattered in the light mixing chamber strikes either the reflecting surfaces or the light transmissive body.

15. The lighting apparatus as set forth in claim 14, wherein the reflecting surfaces have reflectivity of greater than 95%.

16. The lighting apparatus as set forth in claim 14, wherein the at least one LED chip comprises a set of LED chips and the light transmissive body including a phosphor comprises a phosphor panel behind which the set of LED chips is mounted.

17. The lighting apparatus as set forth in claim 16, wherein the reflecting surfaces in combination with the phosphor panel surround the set of LEDs.

18. The lighting apparatus as set forth in claim 17, wherein the reflecting surfaces do not comprise phosphor.

19. The lighting package as set forth in claim 14, wherein the reflecting surfaces comprise a reflector cup.

20. A lighting apparatus comprising:
a light source comprising a set of (LED) chips disposed on an electrical interconnect board;
a phosphor surface spaced apart from the light source, the phosphor surface comprising phosphor configured to perform wavelength conversion of light emitted by the light source; and
reflecting surfaces not comprising phosphor combining with the phosphor surface to surround the set of LEDs.

21. The lighting apparatus as set forth in claim 20, wherein the reflecting surfaces and the phosphor surface are arranged and dimensioned respective to the light source such that most light scattered back from the phosphor surface strikes either the reflecting surfaces or the phosphor surface.

22. The lighting apparatus as set forth in claim 20, wherein the electrical interconnect board is a reflecting electrical interconnect board and the reflecting surfaces include the reflecting electrical interconnect board.

23. The lighting apparatus as set forth in claim 20, wherein the set of LEDs comprises multiple blue or UV emitting LEDs.

24. The lighting apparatus as set forth in claim 20, wherein the lighting apparatus comprises a downwardly oriented downlight.

25. The lighting apparatus as set forth in claim 20, wherein the lighting apparatus comprises a panel lamp in which the phosphor surface comprises a phosphor panel and the set of LEDs is mounted behind the phosphor panel.

26. A lighting apparatus comprising:
a support surface;
a light source comprising at least one light emitting diode (LED) chip, the light source being disposed on the support surface;
an arcuate phosphor surface comprising phosphor disposed over and spaced apart from the light source, said phosphor surface having a perimeter larger than a perimeter of the support surface, the phosphor configured to perform wavelength conversion of light emitted by the light source; and reflecting surfaces extending between the smaller perimeter of the support surface and larger perimeter of the phosphor surface;

wherein the support surface, the phosphor surface, and the reflecting surfaces are arranged and dimensioned respective to the light source such that most light scattered back from the phosphor surface strikes either the reflecting surfaces or the phosphor surface.

* * * * *